(12) United States Patent
Hashiguchi

(10) Patent No.: US 9,787,044 B2
(45) Date of Patent: Oct. 10, 2017

(54) METHOD OF MANUFACTURING A BOARD-TO-BOARD CONNECTOR FOR ELECTRICALLY CONNECTING TWO CIRCUIT BOARDS

(71) Applicant: JAPAN AVIATION ELECTRONICS INDUSTRY, LIMITED, Shibuya-ku, Tokyo (JP)

(72) Inventor: Osamu Hashiguchi, Tokyo (JP)

(73) Assignee: JAPAN AVIATION ELECTRONICS INDUSTRY, LIMITED, Tokyo (JP)

(*) Notice: Subject to any disclaimer, the term of this patent is extended or adjusted under 35 U.S.C. 154(b) by 170 days.

(21) Appl. No.: 14/944,274

(22) Filed: Nov. 18, 2015

(65) Prior Publication Data

US 2016/0072246 A1    Mar. 10, 2016

Related U.S. Application Data

(62) Division of application No. 14/467,258, filed on Aug. 25, 2014, now Pat. No. 9,220,163.

(30) Foreign Application Priority Data

Sep. 17, 2013 (JP) ................... 2013-192150

(51) Int. Cl.
| | |
|---|---|
| *H01R 4/50* | (2006.01) |
| *H01R 43/20* | (2006.01) |
| *H01R 12/73* | (2011.01) |
| *H05K 1/00* | (2006.01) |

(52) U.S. Cl.
CPC ........... *H01R 43/205* (2013.01); *H01R 12/73* (2013.01); *H05K 1/00* (2013.01); *Y10T 29/49204* (2015.01)

(58) Field of Classification Search
CPC .......................... H01R 12/7076; H01R 12/82
USPC ............................. 29/884; 439/342, 74, 376
See application file for complete search history.

(56) References Cited

U.S. PATENT DOCUMENTS

| | | | | |
|---|---|---|---|---|
| 3,907,394 A * | 9/1975 | Barnes | ................ | H01R 13/629 439/342 |
| 5,395,250 A * | 3/1995 | Englert, Jr. | .......... | H01R 12/716 439/65 |
| 6,205,660 B1 * | 3/2001 | Fjelstad | ............... | G01R 1/0466 216/13 |
| 6,575,766 B1 * | 6/2003 | Xie | ...................... | H05K 7/1092 439/70 |
| 7,185,430 B2 * | 3/2007 | Ochiai | ................... | H01R 43/16 29/874 |
| 7,587,817 B2 * | 9/2009 | Williams | ............. | H01R 12/526 29/874 |
| 7,651,338 B2 * | 1/2010 | Miyamoto | ......... | H01R 13/2442 439/66 |

(Continued)

FOREIGN PATENT DOCUMENTS

JP     2012226977 A    11/2012

*Primary Examiner* — Neil Abrams
(74) *Attorney, Agent, or Firm* — Holtz, Holtz & Volek PC

(57) ABSTRACT

A method of manufacturing a board-to-board connector capable of preventing a short-circuit from occurring between contacts when connectors are fitted to each other. Pin-shaped male-side contact portions protrude from one surface of a male-side insulating film, and male-side terminal portions are provided on the other surface of said male-side insulating film. This makes it possible to prevent a short-circuit from occurring between adjacent female-side contacts by the male-side contacts.

10 Claims, 38 Drawing Sheets

(56) References Cited

U.S. PATENT DOCUMENTS

| | | | | |
|---|---|---|---|---|
| 8,137,114 | B1 * | 3/2012 | Peng | H01R 12/716 |
| | | | | 439/660 |
| 8,342,890 | B2 * | 1/2013 | Zhu | H01R 12/716 |
| | | | | 439/682 |
| 8,465,328 | B2 * | 6/2013 | Iida | H01R 4/58 |
| | | | | 439/660 |
| 8,475,184 | B2 * | 7/2013 | Hasegawa | H01R 13/112 |
| | | | | 439/345 |
| 8,513,523 | B2 * | 8/2013 | Ambo | H01R 12/57 |
| | | | | 174/260 |
| 8,602,811 | B2 * | 12/2013 | Takahashi | H01R 12/716 |
| | | | | 439/376 |
| 8,632,345 | B2 | 1/2014 | Shibata et al. | |
| 8,821,178 | B2 * | 9/2014 | Fukui | H01R 4/48 |
| | | | | 439/342 |
| 9,106,006 | B2 * | 8/2015 | Fukui | H01R 4/04 |
| 9,196,980 | B2 * | 11/2015 | Rathburn | H01C 1/14 |
| 9,219,338 | B2 * | 12/2015 | Sagayama | H01R 24/005 |
| 9,220,163 | B2 * | 12/2015 | Hashiguchi | H01R 12/73 |
| 9,252,515 | B2 * | 2/2016 | Komoto | H01R 12/716 |
| 9,281,585 | B2 * | 3/2016 | Komoto | H01R 12/714 |
| 9,281,587 | B2 * | 3/2016 | Komoto | H01R 12/714 |
| 9,293,846 | B2 * | 3/2016 | Komoto | H01R 12/716 |
| 9,614,321 | B2 * | 4/2017 | Nakamura | H01R 13/6205 |
| 2002/0151203 | A1 | 10/2002 | Sagano et al. | |
| 2002/0192994 | A1 | 12/2002 | Turner et al. | |
| 2004/0127085 | A1 | 7/2004 | Chen et al. | |
| 2004/0214468 | A1 | 10/2004 | Chang et al. | |
| 2005/0090137 | A1 | 4/2005 | Gottlieb | |

\* cited by examiner

METHOD OF MANUFACTURING A BOARD-TO-BOARD CONNECTOR FOR ELECTRICALLY CONNECTING TWO CIRCUIT BOARDS

CROSS REFERENCE TO RELATED APPLICATION

This application is a Divisional application of U.S. Ser. No. 14/467,258, filed on Aug. 25, 2014, which is based upon and claims the benefit of priority under 35 USC 119 of Japanese Patent Application No. 2013-192150 filed on Sep. 17, 2013, the entire contents of both of which are incorporated herein by reference.

BACKGROUND OF THE INVENTION

Field of the Invention

This invention relates to a method of manufacturing a board-to-board connector for electrically connecting two circuit boards.

Description of the Related Art

Conventionally, as shown in FIGS. 28 to 38, there has been proposed a board-to-board connector comprising a male connector 901 and a female connector 1101 that can be fitted to the male connector 901 (see Japanese Laid-Open Patent Publication (Kokai) No. 2012-226977).

The male connector 901 is mounted on a first circuit board 991 (see FIGS. 36 and 37). As shown in FIG. 28, the male connector 901 includes a base film 915 having insulating properties, conductor traces 951 provided on one surface of the base film 915, and a reinforcing layer 916 provided on the other surface of the base film 915. The base film 915 is formed of resin, such as polyimide, and the reinforcing layer 916 is formed of metal, such as stainless steel.

The conductor traces 951 are formed by patterning a copper foil affixed to the one surface of the base film 915 by performing etching thereon. The conductor traces 951 are arranged at a predetermined pitch.

As shown in FIGS. 28 to 31, each conductor trace 951 includes a protruding terminal 953. The conductor trace 951 has a rectangular plate-like shape. The protruding terminal 953 has a cylindrical shape, and is circular in cross-sectional shape (see FIGS. 30 and 31). The protruding terminal 953 protrudes from a surface of the conductor trace 951. The protruding terminal 953 is integrally formed with the conductor trace 951 by etching using a photolithography technique or the like method.

A pair of sides of the base film 951, extending along a longitudinal direction D, are each formed into a comb-like shape such that recesses 915A and protrusions 915B are alternately arranged (see FIG. 28). The recesses 915A and the conductor traces 951 positionally correspond to each other. Therefore, part of each conductor trace 951 is exposed on a mounting surface 901A of the male connector 901 (see FIG. 29). Each exposed portion (tale portion 958) of each conductor trace 951 is soldered to a connection pad (not shown) of the first circuit board 991 shown in FIGS. 36 and 37.

The female connector 1101 is plate-shaped (see FIGS. 33 and 34), and is mounted on a second circuit board 1191 (see FIGS. 36 and 37). The female connector 1101 includes frame bodies 1111. Each frame body 1111 is a plate-shaped member having a layer structure in which a cover film 1117 and a frame reinforcing layer 1116 formed by a pair of reinforcing layers are laminated in the mentioned order on conductor traces 1150, described hereinafter (see FIG. 32).

The cover film 1117 is an insulating thin plate member and is formed of resin, such as polyimide. The frame reinforcing layer 1116 is formed of metal, such as stainless steel. The pair of reinforcing layers of the frame reinforcing layer 1116 are referred to as the first reinforcing layer 1116A and the second reinforcing layer 1116B.

Part surrounded by the frame bodies 1111 forms a connection recess 1114 (see FIG. 33) for accommodating part of a main body 911 of the male connector 901 except main body end portions 911C (see FIGS. 29 and 30). As shown in FIGS. 32 to 34, a bottom portion 1114A of the connection recess 1114 is a plate-shaped member having a layer structure in which a reinforcing layer 1118, a base film 1115, and the conductor traces 1150 are laminated in the mentioned order starting from the side of a mounting surface 1101A. The conductor traces 1150 are arranged on one surface of the base film 1115, and the reinforcing layer 1118 is arranged on the other surface of the same. The material and manufacturing method used for forming the conductor traces 1150 and the reinforcing layer 1118 are the same as those for the conductor traces 951 and the reinforcing layer 916 of the male connector 901.

The conductor traces 1150 include female conductors 1151 and auxiliary conductors 1152. The female conductors 1151 are arranged at equally-spaced intervals. Four of the plurality of arranged female conductors 1151 are replaced by the auxiliary conductors 1152, respectively.

Each female conductor 1151 includes a reception terminal 1153 (see FIG. 33). The reception terminal 1153 is accommodated in a terminal accommodating opening 1154. As shown in FIG. 35, the reception terminal 1153 includes a main arm portion 1153A, an auxiliary arm portion 1153B, and a protruding portion 1153C.

Each auxiliary conductor 1152 includes a holding portion 1157 (see FIGS. 33 and 35). The holding portion 1157 is accommodated in a holding portion-accommodating opening 1159. The holding portion 1157 includes base portions 1157A, first arm portions 1157B, second arm portions 1157D, and protruding portions 1157C.

To fit the male connector 901 and the female connector 1101, as shown in FIGS. 36 and 37, first, in a state in which a fitting surface 901B (see FIG. 31) of the male connector 901 and a fitting surface 1101B (see FIG. 33) of the female connector 1101 are opposed to each other, the male connector 901 is moved down to the female connector 1101 as indicated by an arrow B in FIG. 36, and part of the main body 911 of the male connector 901 except the main body end portions 911C is accommodated in the connection recess 1114. At this time, the protruding terminals 953 are each inserted into a main inner opening 1154A1 inside the main arm portion 1153A, which is inside the reception terminal 1153, and a first inner opening 1159A1 inside the holding portion 1157, which is located between the first arm portions 1157B (see FIG. 35).

Next, the male connector 901 is slid in a locking direction C (see FIG. 37) relative to the female connector 1101. When the male connector 901 has been slid, the protruding terminals 953 are each enter a positioning opening 1154C inside the reception terminal 1153, and a second inner opening 1159A2 inside the holding portion 1157 (see FIGS. 35 and 38). As a result, spacing between a contact portion 1153A3 of the reception terminal 1153, a contact portion 1153B3 of the auxiliary arm portion 1153B, and the protruding portion 1153C is widened by side portions of the protruding terminal 953. Then, by action of returning forces of the main arm portion 1153A and the auxiliary arm portion 1153B, the contact portion 1153A3 of the main arm portion 1153A, the contact portion 1153B3 of the auxiliary arm portion 1153B, and the protruding portion 1153C are in a state pressed against the side portions of the protruding terminal 953. That is, the contact portion 1153A3 of the main arm portion 1153A, the contact portion 1153B3 of the auxiliary arm portion 1153B, and the protruding portion 1153C hold the side portions of the protruding terminal 953 by the returning forces thereof. Thus, the protruding terminal 953 and the reception terminal 1153 are positively brought into contact with each other to attain electrical conduction.

However, since the plate-shaped conductor traces 951 of the male connector 901 are provided on the one surface of the base film 915, and the cylindrical protruding terminals 953 protrude from the surfaces of the conductor traces 951, after the part of the main body 911 of the male connector 901 except the main body end portions 911C is accommodated in the connection recess 1114, if the male connector 901 is erroneously slid in the longitudinal direction D of the connector (see FIG. 28) relative to the female connector 1101, each conductor trace 951 of the male connector 901 may short-circuit adjacent ones of the female conductors 1151. To avoid this short-circuit, it is only necessary to increase spacing between each adjacent pair of conductor traces 951 of the male connector 901 or increase spacing between the conductor traces 951 and the female conductors 1151 in the fitting direction, but this increases the size of the board-to-board connector.

SUMMARY OF THE INVENTION

The present invention has been contrived in view of these circumstances, it being an objective thereof to provide a method for manufacturing a board-to-board connector in which it is possible to make it difficult for a short-circuit to occur between female-side contacts during fitting, without increasing the size of the board-to-board connector.

In order to achieve the objective described above, in a first aspect of the present invention, there is provided a method for manufacturing a male connector of a board-to-board connector that comprises a male connector which is mounted on a first substrate, and a female connector which is mounted on a second substrate and which can be fitted to the male connector, the board-to-board connector electrically connecting between the first substrate and the second substrate, the male connector having: a male-side insulating film; a plurality of male-side contacts which are provided on said male-side insulating film; and a male-side reinforcing member which is provided on said male-side insulating film, each of the male-side contacts having a male-side terminal portion which is connected to the first substrate, and a pin-shaped male-side contact portion which is formed continuously with said male-side terminal portion such that said male-side contact portion protrudes from one surface of said male-side insulating film and can be brought into contact with a corresponding one of female-side contacts of the female connector, a plurality of said male-side contact portions being arrayed on the one surface of said male-side insulating film, a plurality of said male-side terminal portions being arrayed on the other surface of said male-side insulating film, and said male-side reinforcing member having a male-side reinforcing member main body portion which is arranged along the plurality of said male-side terminal portions on the other surface, wherein the method includes: a thin film processing step for providing a metal thin film on the other surface of said male-side insulating film; a patterning step for etching said metal thin film and forming the plurality of said male-side terminal portions and said male-side reinforcing member main body portion after said thin film processing step; a through-hole-forming step for forming, on said male-side insulating film by performing an etching process, through-holes which pass through to said male-side terminal portions after said patterning step; and a contact-portion-forming step for forming said pin-shaped male-side contact portions at the positions of said through-holes after said through-hole-forming step.

In order to achieve the objective described above, in a second aspect of the present invention, the female connector has a female-side insulating film, and a plurality of said female-side contacts provided on said female-side insulating film; each of the female-side contacts has a female-side contact portion which is provided on one surface of said female-side insulating film and which can be brought into contact with a corresponding one of said male-side contact portions, and a female-side terminal portion which is formed continuously with said female-side contact portion such that said female-side terminal portion protrudes from the other surface of said female-side insulating film, said female-side terminal portion being connected to the second substrate; a plurality of said female-side contact portions are arrayed on the one surface of said female-side insulating film; and a plurality of said female-side terminal portions are arrayed on the other surface of said female-side insulating film.

Preferably, said male-side reinforcing member has: fixing portions that are formed continuously with said male-side reinforcing member main body portion, and that are arranged on both end portions of the other surface of said male-side insulating film in the direction in which the plurality of said male-side contact portions are arrayed; and protruding portions that are formed continuously with said fixing portions, and that are arranged on both end portions of the one surface of said male-side insulating film in the direction in which the plurality of said male-side contact portions are arrayed, and the female connector has protruding-portion-supporting members that are arranged on both end portions of the one surface of said female-side insulating film in the direction in which the plurality of said female-side contact portions are arrayed, and that have protruding-portion-receiving holes for guiding said protruding portions toward the second substrate, wherein the method for manufacturing a male connector of a board-to-board connector includes: a thin film processing step for providing a metal thin film on the other surface of said male-side insulating film; a patterning step for etching said metal thin film and forming the plurality of said male-side terminal portions, said male-side reinforcing member main body portion, and said fixing portions after said thin film processing step; a through-hole-forming step for forming, on said male-side insulating film by performing an etching process, through-holes which pass through to said male-side terminal portions and protruding-portion through-holes which pass through to said fixing portions after said patterning step; and a contact-portion-forming step for forming said pin-shaped male-side contact portions at the positions of said through-holes, and forming said protruding portions at the positions of said protruding-portion through-holes, after said through-hole-forming step.

More preferably, each of the female-side contact portions is elastically deformed, when said protruding portions are inserted in said protruding-portion-receiving holes of the female connector, to thereby sandwich each of the corresponding male-side contact portions in a prescribed direction orthogonal to the thickness direction of said female-side insulating film, whereby a prescribed contact force is generated between said female-side contact portion and said male-side contact portion, wherein the method for manufacturing a male contact of a board-to-board connector includes: a thin film processing step for providing a metal thin film on the other surface of said male-side insulating film; a patterning step for etching said metal thin film and forming the plurality of said male-side terminal portions, said male-side reinforcing member main body portion, and said fixing portions after said thin film processing step; a through-hole-forming step for forming, on said male-side insulating film by performing an etching process, through-holes which pass through to said male-side terminal portions and protruding-portion through-holes which pass through to said fixing portions after said patterning step; and a contact-portion-forming step for forming said pin-shaped male-side contact portions at the positions of said through-holes, and forming said protruding portions at the positions of said protruding-portion through-holes, after said through-hole-forming step.

In order to achieve the objective described above, in a third aspect of the present invention, there is provided a method for manufacturing a male connector of a board-to-board connector that comprises a male connector which is mounted on a first substrate, and a female connector which is mounted on a second substrate and which can be fitted to the male connector, the board-to-board connector electrically connecting between the first substrate and the second substrate, the male connector having: a male-side insulating film; a plurality of male-side contacts which are provided on said male-side insulating film; and a male-side reinforcing member which is provided on said male-side insulating film, each of the male-side contacts having a male-side terminal portion which is connected to the first substrate, and a pin-shaped male-side contact portion which is formed continuously with said male-side terminal portion such that said male-side contact portion protrudes from one surface of said male-side insulating film and can be brought into contact with a corresponding one of female-side contacts of the female connector, a plurality of said male-side contact portions being arrayed on the one surface of said male-side insulating film, a plurality of said male-side terminal portions being arrayed on the other surface of said male-side insulating film, and said male-side reinforcing member having a male-side reinforcing member main body portion which is arranged along the plurality of said male-side terminal portions on the other surface, wherein the method includes: a contact-portion-side thin film processing step for providing a contact-portion-side metal thin film on the one surface of said male-side insulating film; a through-hole-forming step for forming, on said male-side insulating film by performing an etching process, through-holes which pass through to said contact-portion-side metal thin film after said contact-portion-side thin film processing step; a terminal-portion-side thin film processing step for providing a terminal-portion-side metal thin film on the other surface of said male-side insulating film after said through-hole-forming step; and a patterning step for etching said contact-portion-side metal thin film and forming said pin-shaped male-side contact portions at the positions of said through-holes, and etching said terminal-portion-side metal thin film and forming said male-side terminal portions and said male-side reinforcing member main body portion, after said terminal-portion-side thin film processing step.

Preferably, the female connector has a female-side insulating film, and a plurality of said female-side contacts provided on said female-side insulating film; each of the female-side contacts has a female-side contact portion which is provided on one surface of said female-side insulating film and which can be brought into contact with a corresponding one of said male-side contact portions, and a female-side terminal portion which is formed continuously with said female-side contact portion such that said female-side terminal portion protrudes from the other surface of said female-side insulating film, said female-side terminal portion being connected to the second substrate; a plurality of said female-side contact portions are arrayed on the one surface of said female-side insulating film; and a plurality of said female-side terminal portions are arrayed on the other surface of said female-side insulating film.

In order to achieve the above objective, in a fourth aspect of the present invention, there is provided a method for manufacturing a male connector of a board-to-board connector, in which said male-side reinforcing member has: fixing portions that are formed continuously with said male-side reinforcing member main body portion, and that are arranged on both end portions of the other surface of said male-side insulating film in the direction in which the plurality of said male-side contact portions are arrayed; and protruding portions that are formed continuously with said fixing portions, and that are arranged on both end portions of the one surface of said male-side insulating film in the direction in which the plurality of said male-side contact portions are arrayed, and the female connector has protruding-portion-supporting members that are arranged on both end portions of the one surface of said female-side insulating film in the direction in which the plurality of said female-side contact portions are arrayed, and that have protruding-portion-receiving holes for guiding said protruding portions toward the second substrate, wherein the method includes: a contact-portion-side thin film processing step for providing a contact-portion-side metal thin film on the one surface of said male-side insulating film; a through-hole-forming step for forming, on said male-side insulating film by performing an etching process, through-holes which pass through to said contact-portion-side metal thin film and protruding-portion through-holes after said contact-portion-side thin film processing step; a terminal-portion-side thin film processing step for providing a terminal-portion-side metal thin film on the other surface of said male-side insulating film after said through-hole-forming step; and a patterning step for etching said contact-portion-side metal thin film and forming said pin-shaped male-side contact portions at the positions of said through-holes, as well as forming said protruding portions at the positions of said protruding-portion through-holes, and etching said terminal-portion-side metal thin film and forming said male-side terminal portions, said male-side reinforcing member, and said fixing portions, after said terminal-portion-side thin film processing step.

Preferably, each of the female-side contact portions is elastically deformed, when said protruding portions are inserted in said protruding-portion-receiving holes of the female connector, to thereby sandwich each of the corresponding male-side contact portions in a prescribed direction orthogonal to the thickness direction of said female-side insulating film, whereby a prescribed contact force is generated between said female-side contact portion and said male-side contact portion.

In order to achieve the above objective, in a fifth aspect of the present invention, there is provided a method for manufacturing a female connector of a board-to-board connector that comprises a male connector which is mounted on a first substrate, and a female connector which is mounted on a second substrate and which can be fitted to the male connector, the board-to-board connector electrically connecting between the first substrate and the second substrate, the male connector having: a male-side insulating film; a plurality of male-side contacts which are provided on said male-side insulating film; and a male-side reinforcing member which is provided on said male-side insulating film, each of the male-side contacts having a male-side terminal portion which is connected to the first substrate, and a pin-shaped male-side contact portion which is formed continuously with said male-side terminal portion such that said male-side contact portion protrudes from one surface of said male-side insulating film and can be brought into contact with a corresponding one of female-side contacts of the female connector, a plurality of said male-side contact portions being arrayed on the one surface of said male-side insulating film, a plurality of said male-side terminal portions being arrayed on the other surface of said male-side insulating film, said male-side reinforcing member having a male-side reinforcing member main body portion which is arranged along the plurality of said male-side terminal portions on the other surface, the female connector having: a female-side insulating film; and a plurality of said female-side contacts provided on said female-side insulating film, each of the female-side contacts having a female-side contact portion which is provided on one surface of said female-side insulating film and which can be brought into contact with a corresponding one of said male-side contact portions, and a female-side terminal portion which is formed continuously with said female-side contact portion such that said female-side terminal portion protrudes from the other surface of said female-side insulating film, said female-side terminal portion being connected to the second substrate, a plurality of said female-side contact portions being arrayed on the one surface of said female-side insulating film, and a plurality of said female-side terminal portions being arrayed on the other surface of said female-side insulating film, wherein the method includes: a thin film processing step for providing a metal thin film on the one surface of said female-side insulating thin film; a patterning step for etching said metal thin film on the one surface of said female-side insulating film and forming the plurality of said female-side contact portions after said thin film processing step; a cutout- and through-hole-forming step for forming, on said female-side insulating film by performing an etching process, cutouts and through-holes which pass through to said female-side contact portions after said patterning step; and a terminal-portion-forming step for forming, in the other surface of said female-side insulating film, a plurality of said female-side terminal portions at the positions of said cutouts after said cutout- and through-hole-forming step.

In order to achieve the above objective, in a sixth aspect of the present invention, there is provided a method for manufacturing a female connector of a board-to-board connector that comprises a male connector which is mounted on a first substrate, and a female connector which is mounted on a second substrate and which can be fitted to the male connector, the board-to-board connector electrically connecting between the first substrate and the second substrate, the male connector having: a male-side insulating film; a plurality of male-side contacts which are provided on said male-side insulating film; and a male-side reinforcing member which is provided on said male-side insulating film, each of the male-side contacts having a male-side terminal portion which is connected to the first substrate, and a pin-shaped male-side contact portion which is formed continuously with said male-side terminal portion such that male-side contact portion protrudes from one surface of said male-side insulating film and can be brought into contact with a corresponding one of female-side contacts of the female connector, a plurality of said male-side contact portions being arrayed on the one surface of said male-side insulating film, a plurality of said male-side terminal portions being arrayed on the other surface of said male-side insulating film, said male-side reinforcing member having a male-side reinforcing member main body portion which is arranged along the plurality of said male-side terminal portions on the other surface, the female connector having: a female-side insulating film; and a plurality of said female-side contacts provided on said female-side insulating film, each of the female-side contacts having a female-side contact portion which is provided on one surface of said female-side insulating film and which can be brought into contact with a corresponding one of said male-side contact portions, and a female-side terminal portion which is formed continuously with said female-side contact portion such that said female-side terminal portion protrudes from the other surface of said female-side insulating film, said female-side terminal portion being connected to the second substrate, a plurality of said female-side contact portions being arrayed on the one surface of said female-side insulating film, a plurality of said female-side terminal portions being arrayed on the other surface of said female-side insulating film, said male-side reinforcing member having: fixing portions that are formed continuously with said male-side reinforcing member main body portion, and that are arranged on both end portions of the other surface of said male-side insulating film in the direction in which the plurality of said male-side contact portions are arrayed; and protruding portions that are formed continuously with said fixing portions, and that are arranged on both end portions of the one surface of said male-side insulating film in the direction in which the plurality of said male-side contact portions are arrayed, and the female connector having protruding-portion-supporting members that are arranged on both end portions of the one surface of said female-side insulating film in the direction in which the plurality of said female-side contact portions are arrayed, and that have protruding-portion-receiving holes for guiding said protruding portions toward the second substrate, wherein the method includes: a thin film processing step for providing a metal thin film on the one surface of said female-side insulating film; a patterning step for etching said metal thin film on the one surface of said female-side insulating film and forming the plurality of said female-side contact portions and said protruding-portion-supporting members after said thin film processing step; a cutout- and through-hole-forming step for forming, on said female-side insulating film by performing an etching process, cutouts and through-holes which pass through to said female-side contact portions after said patterning step; and a terminal-portion-forming step for forming, in the other surface of said female-side insulating film, a plurality of said female-side terminal portions at the positions of said cutouts after said cutout- and through-hole-forming step.

According to the present invention, it is possible to provide a method for manufacturing a board-to-board connector in which it is possible to make it difficult for a short-circuit to occur between female-side contacts during fitting, without increasing the size of the board-to-board connector.

The above and other objectives, features, and advantages of the present invention shall become more apparent from the following detailed description based on the accompanying drawings.

DETAILED DESCRIPTION OF THE PREFERRED EMBODIMENT

The present invention will now be described in detail with reference to the drawings showing preferred embodiments thereof.

Figure 1:
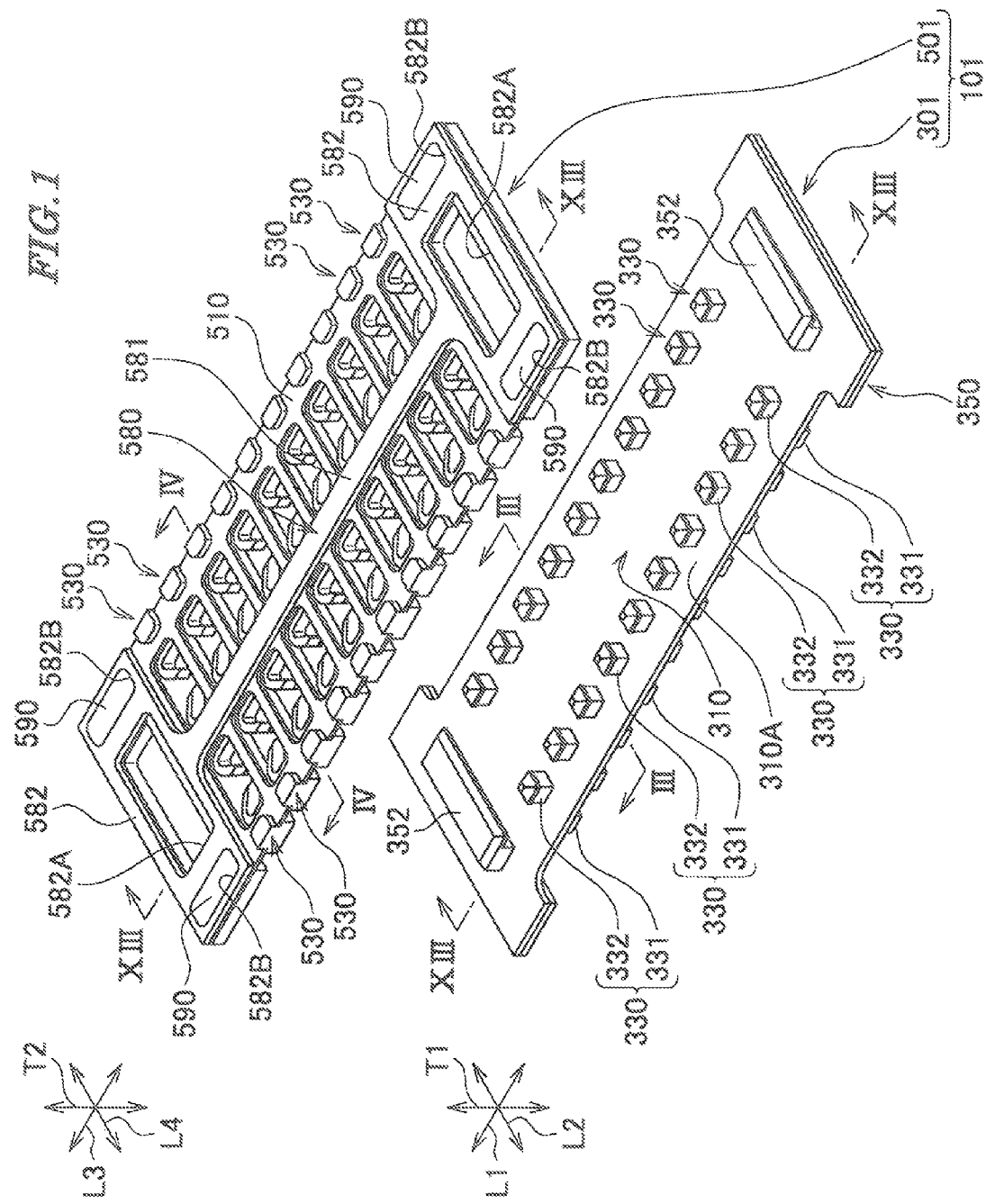
FIG. 1 is a perspective view of a board-to-board connector according to a first embodiment of the present invention, in a state before a male connector and a female connector are fitted to each other.
Figure 2:
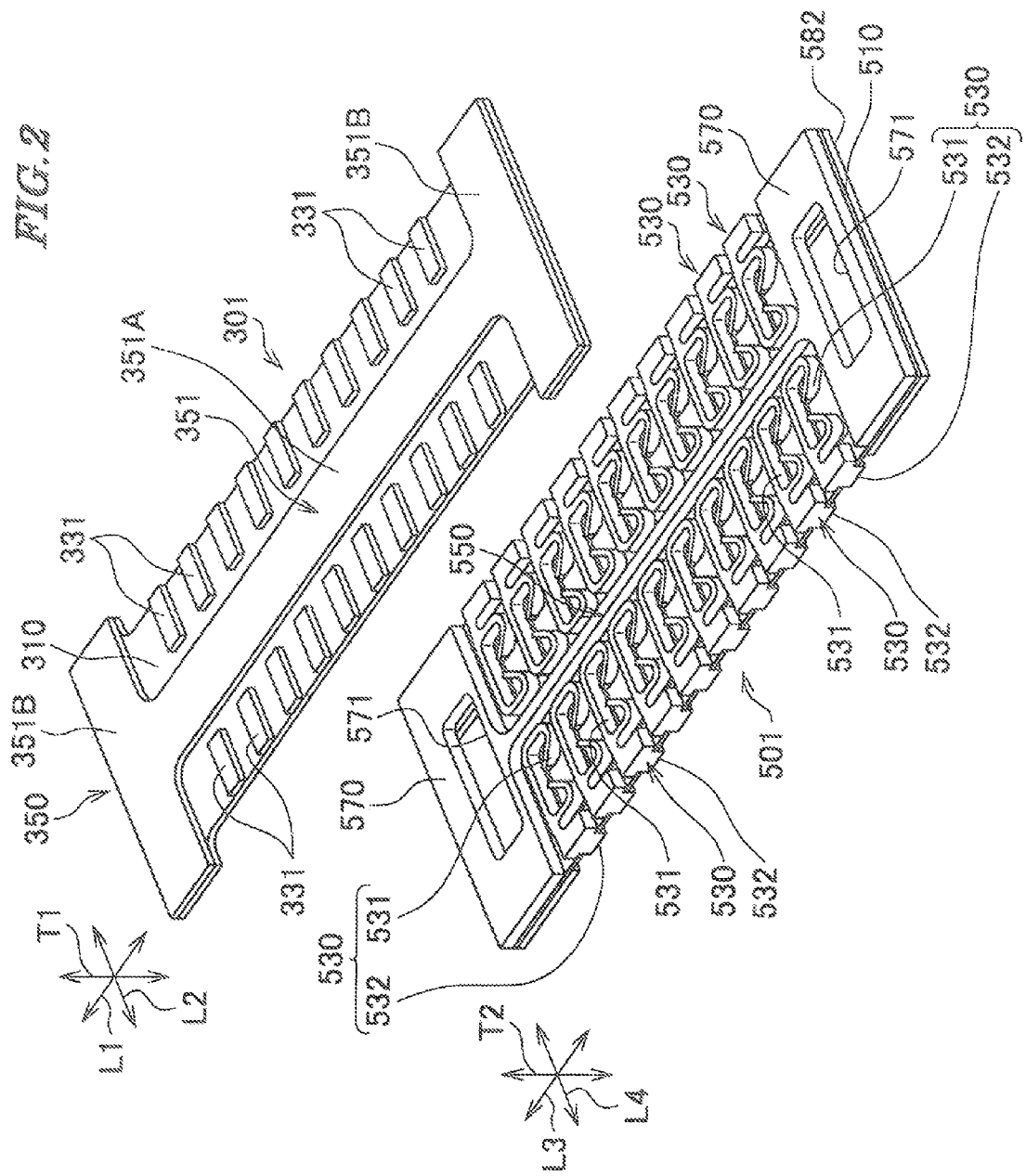
FIG. 2 is a perspective view showing a state in which the board-to-board connector shown in FIG. 1 is inverted upside down.

As shown in FIGS. 1 and 2, a board-to-board connector 101 according to a first embodiment of the present invention comprises a male connector 301 that is mounted on a first circuit board (first substrate), not shown, and a female connector 501 that is mounted on a second circuit board (second substrate), not shown, and can be fitted to the male connector 301. The board-to-board connector 101 electrically connects the first circuit board and the second circuit board, which are arranged opposed to each other.

The male connector 301 can be fitted to and removed from the female connector 501 along a thickness direction T2 of a female-side insulating film 510 of the female connector 501.

Figure 3:
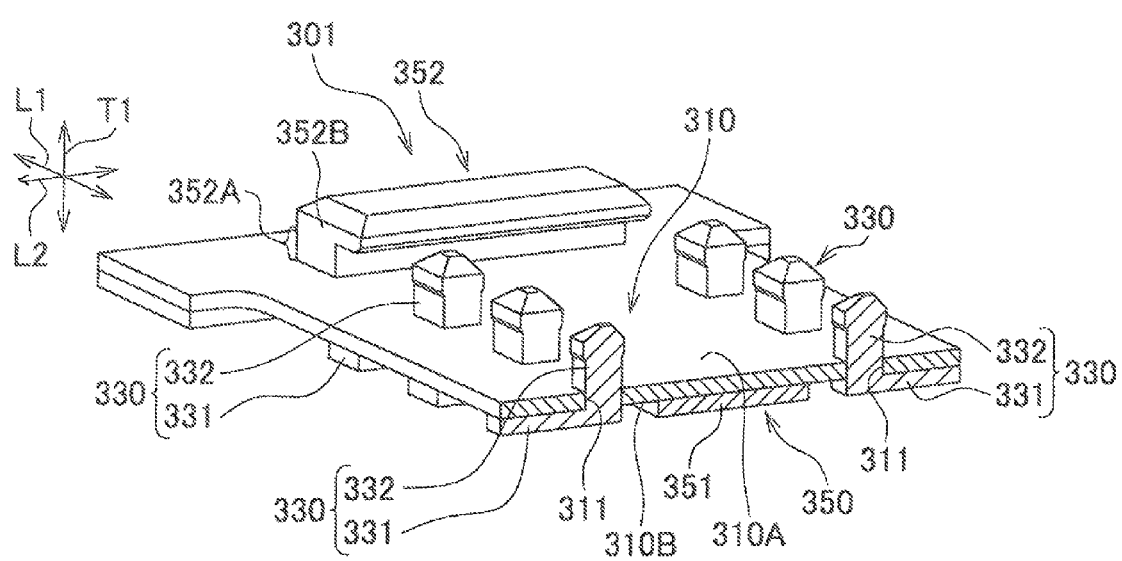
FIG. 3 is a perspective view showing a state cut along III-III in FIG. 1.

As shown in FIGS. 1, 2, and 3, the male connector 301 includes a male-side insulating film 310, a plurality of male-side contacts 330 provided on the male-side insulating film 310, and a male-side reinforcing member 350 provided on the male-side insulating film 310.

The planar shape of the male-side insulating film 310 is a belt-like shape. The material of the male-side insulating film 310 is e.g. resin, such as polyimide.

Each male-side contact 330 includes a male-side terminal portion 331 that is soldered to a pad (not shown) of the first circuit board, and a prism-shaped (pin-shaped) male-side contact portion 332 that is formed continuously with the male-side terminal portion 331, and protrudes from one surface 310A of the male-side insulating film 310. The male-side contact portions 332 are brought into contact with female-side contact portions 531 of female-side contacts 530 of the female connector 501. The material of the male-side terminal portion 331 and the male-side contact portion 332 is e.g. copper or copper alloy.

The male-side contact portion 332 is formed such that a front end portion thereof is expanded (see FIG. 3). The plurality of male-side contact portions 332 are arranged in two rows on the one surface 310A of the male-side insulating film 310. A direction of arranging the plurality of male-side contact portions 332 is parallel to a longitudinal direction L1 of the male-side insulating film 310. The plurality of male-side terminal portions 331 are arranged in two rows on the other surface 310B of the male-side insulating film 310. A direction of arranging the plurality of male-side terminal portions 331 is parallel to the longitudinal direction L1 of the male-side insulating film 310.

The male-side reinforcing member 350 includes a male-side reinforcing member main body 351 having an H-shaped planar shape and protruding portions 352. The male-side reinforcing member main body 351 includes a male-side reinforcing member main body portion 351A and fixing portions 351B which are continuous with opposite ends of the male-side reinforcing member main body portion 351A, respectively, and the protruding portions 352 are formed continuously with the fixing portions 351B. The male-side reinforcing member main body portion 351A is arranged along the plurality of male-side terminal portions 331 (see FIG. 2). The fixing portions 351B are arranged on opposite ends of the other surface 310B of the male-side insulating film 310. The protruding portions 352 are arranged on opposite ends of the one surface 310A of the male-side insulating film 310 in the longitudinal direction L1 of the male-side insulating film 310 (direction of arranging the plurality of male-side contact portions 332). The male-side reinforcing member main body portion 351A is belt-shaped, and is arranged between the two rows of the male-side terminal portions 331. The male-side reinforcing member main body 351 is formed of the same material as that of the male-side terminal portions 331, and is formed simultaneously with formation of the male-side terminal portions 331, as described hereinafter. Each protruding portion 352 includes a rectangular parallelepiped protruding portion main body 352A, and a holding portion 352B which is continuous with a front end of the protruding portion main body 352A. A vertical cross-section of each protruding portion 352 is hook-shaped. The material of the protruding portions 352 is the same as that of the male-side contact portions 332, and the protruding portions 352 are formed simultaneously with formation of the male-side contact portions 332.

Figure 4:
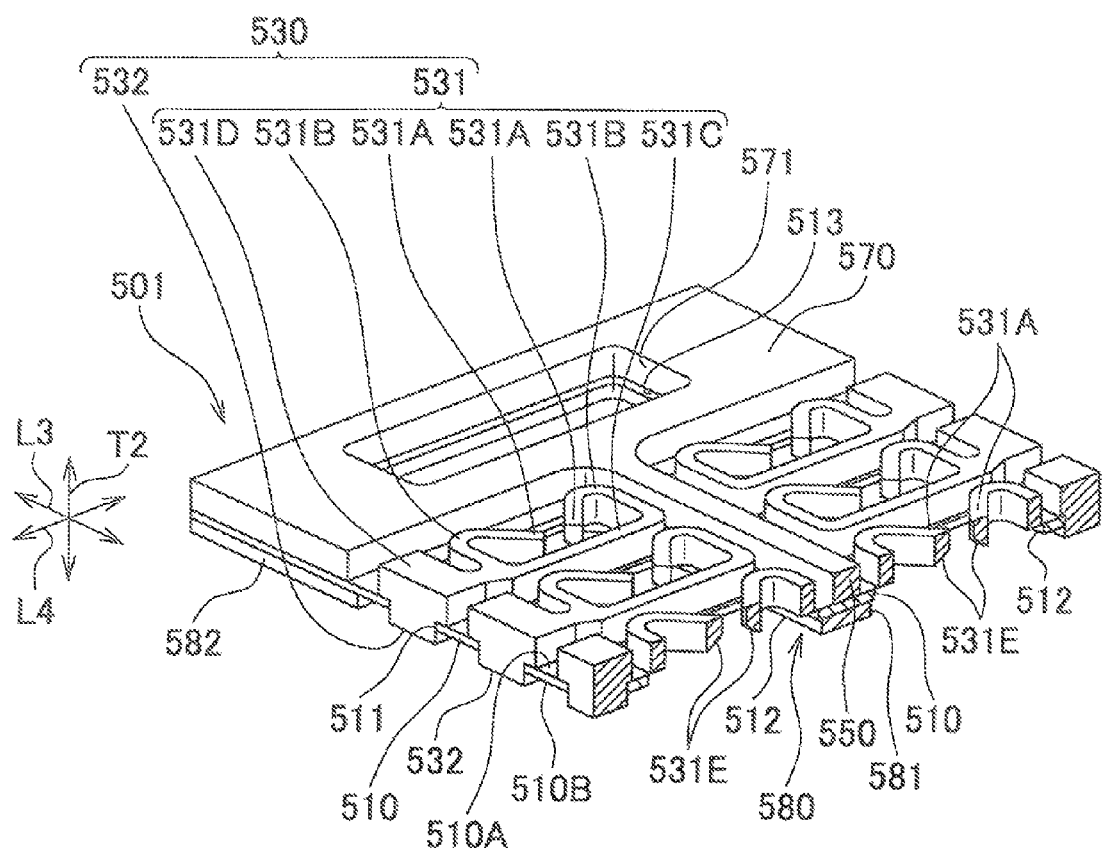
FIG. 4 is a perspective view showing a state cut along IV-IV in FIG. 1.

As shown in FIGS. 1, 2, and 4, the female connector 501 includes the female-side insulating film 510 which is belt-shaped, the plurality of female-side contacts 530 provided on the female-side insulating film 510, a first female-side reinforcing member 550 provided on one surface 510A of the female-side insulating film 510, protruding portion-supporting members 570 each having a protruding portion-receiving hole 571 which guides an associated one of the protruding portions 352 of the male connector 301 toward the second circuit board, a second female-side reinforcing member 580 fitted on the other surface 510B of the female-side insulating film 510, and holddowns 590 formed on the other surface 510B of the female-side insulating film 510.

The female-side insulating film 510 has a plurality of cutouts 511, a plurality of through holes 512 which are holes formed through the female-side insulating film 510, and a pair of through holes 513. The plurality of cutouts 511 are arranged in two rows along with a longitudinal direction L3 of the female-side insulating film 510 (see FIG. 4). The plurality of through holes 512 are formed in two rows along with the longitudinal direction L3 of the female-side insulating film 510. The two rows of the through holes 512 are sandwiched by the two rows of the cutouts 511 in a width direction L4 of the female-side insulating film 510. The pair of through holes 513 are formed through the opposite end portions of the female-side insulating film 510 in the longitudinal direction L3 of the female-side insulating film 510. The through holes 513 and through holes 582A, referred to hereinafter, are opposed to each other.

The female-side contacts 530 are provided on the one surface 510A of the female-side insulating film 510, and each include the female-side contact portion 531 that can be brought into contact with an associated one of the male-side contact portions 332, and a female-side terminal portion 532 that is formed continuously with the female-side contact portion 531 and protrudes from the other surface 510B of the female-side insulating film 510. The female-side terminal portion 532 is soldered to a pad (not shown) of the second circuit board. The female-side contact portion 531 receives the male-side contact portion 332 via the through hole 512. The female-side terminal portion 532 is formed continuously with the female-side contact portion 531 by extending through the cutout 511. The female-side insulating film 510 is formed of the same material as that of the male-side insulating film 310. The female-side contact portion 531 and the female-side terminal portion 532 are formed of e.g. copper or copper alloy.

The plurality of female-side contact portions 531 are arranged in two rows on the one surface 510A of the female-side insulating film 510. A direction of arranging the plurality of female-side contact portions 531 is parallel to the longitudinal direction L3 of the female-side insulating film 510. The plurality of female-side terminal portions 532 are arranged in two rows on the other surface 510B of the female-side insulating film 510. A direction of arranging the plurality of female-side terminal portions 532 is parallel to the longitudinal direction L3 of the female-side insulating film 510.

The first female-side reinforcing member 550 has a long and narrow shape, and is located between the two rows of the female-side contact portions 531. The first female-side reinforcing member 550 connects the two protruding portion-supporting members 570 in a manner continuous therewith.

The protruding portion-supporting members 570 are arranged on the opposite end portions of the one surface 510A of the female-side insulating film 510 in the longitudinal direction L3 of the female-side insulating film 510 (direction of arranging the plurality of female-side contact portions 531).

The second female-side reinforcing member 580 is a metallic plate (e.g. stainless steel plate), and has an H-shaped planar shape. The second female-side reinforcing member 580 includes one second female-side reinforcing member main body 581 and two fixing portions 582. The second female-side reinforcing member main body 581 connects the two fixing portions 582 in a manner continuous therewith. The fixing portions 582 are arranged on the opposite end portions of the other surface 510B of the female-side insulating film 510 in the longitudinal direction L3 of the female-side insulating film 510. Each fixing portion 582 has one through hole 582A and two through holes 582B. The through hole 582A receives an associated one of the holding portions 352B when the male connector 301 is fitted to the female connector 501. Each through hole 582B is formed with the holddown 590. A front end surface of the holddown 590 and the surface of the fixing portion 582 are positioned substantially on the same plane.

Figure 18:
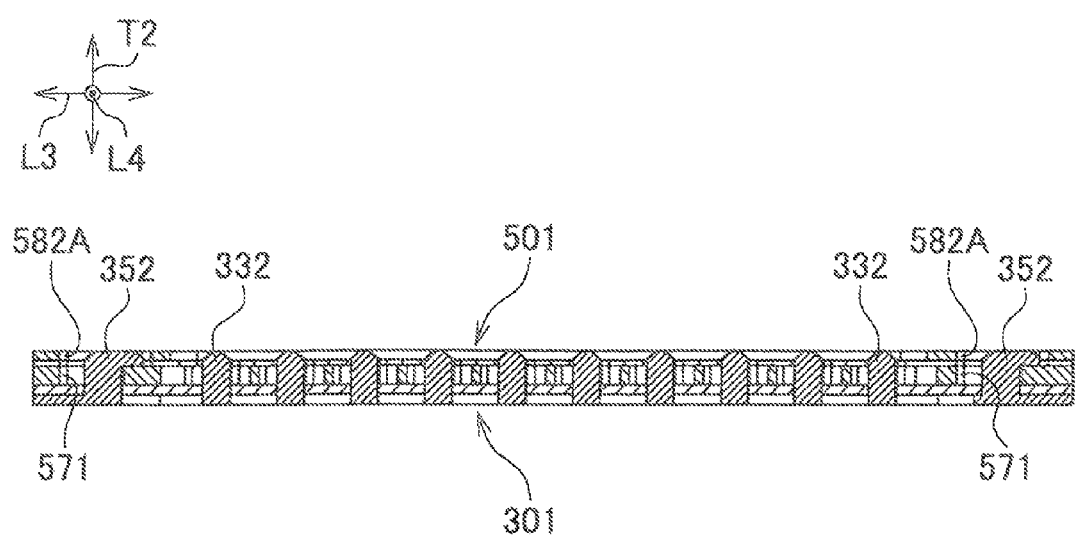
FIG. 18 is a cross-sectional view taken along XVIII-XVIII in FIG. 17.
Figure 19:
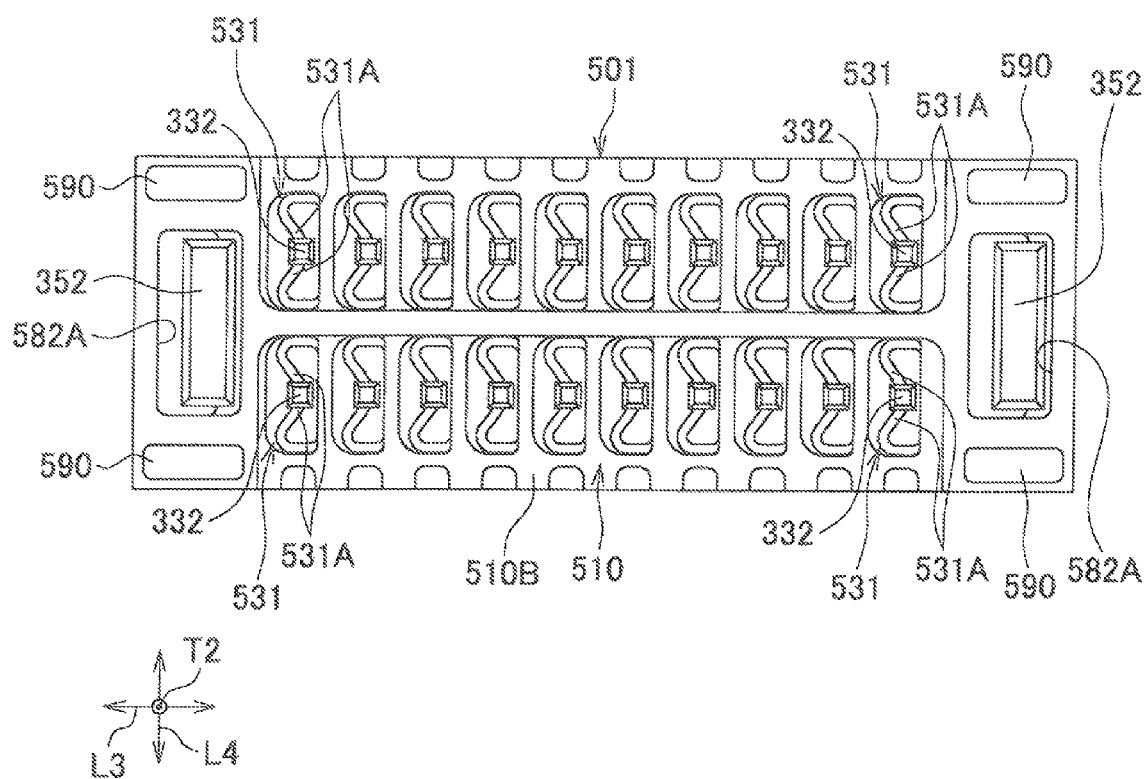
FIG. 19 is a view of the board-to-board connector shown in FIG. 17, as viewed from the mounting surface side of the female connector.

The length of the protruding portion-receiving hole 571 (see FIG. 4) and the through hole 582A (see FIG. 20) in the width direction L4 of the female-side insulating film 510 is slightly larger than the length of the protruding portion 352 (see FIG. 3) in a width direction L2 of the male-side insulating film 310. The length of the protruding portion-receiving hole 571 in the longitudinal direction L3 of the female-side insulating film 510 is slightly larger than the length of the holding portion 352B (see FIG. 3) in the longitudinal direction L1 of the male-side insulating film 310. Further, the through hole 513 (see FIG. 4) is equal to the through hole 582A in length in the longitudinal direction L3 of the female-side insulating film 510. A difference in length between the through hole 582A and the protruding portion-receiving hole 571 in the longitudinal direction L3 of the female-side insulating film 510 is approximately equal to a difference in length between the holding portion 352B and the protruding portion main body 352A in the longitudinal direction L1 of the male-side insulating film 310 (see FIG. 3). The above-mentioned dimensional relationship makes it possible to fit and remove the male connector 301 to and from the female connector 501 in the thickness direction T2 of the female-side insulating film 510, and relatively slide the male connector 301 in the longitudinal direction L3 of the female-side insulating film 510, with respect to the female connector 501, from the protruding portion insertion completion position (see FIG. 15) in which the protruding portions 352 have been inserted in the protruding portion-receiving holes 571, to the sliding completion position (see FIG. 18) in which a predetermined contact force is generated between the male-side contact portions 332 and the female-side contact portions 531. Further, when the male connector 301 has been slid from the protruding portion insertion completion position to the sliding completion position, the holding portions 352B of the protruding portions 352 are hooked to the protruding portion-supporting members 570, respectively, whereby the male connector 301 is locked in the thickness direction T2 of the female-side insulating film 510.

The female-side contact portion 531 of each female-side contact 530 includes, as shown in FIG. 4, a pair of contact point portions 531A, a pair of spring portions 531B, a linking portion 531C, and a fixing portion 531D. The pair of contact point portions 531A are brought into contact with an associated one of the male-side contact portions 332 of the male connector 301 in the sliding completion position. The pair of spring portions 531B are continuous with the contact point portions 531A, respectively, and urge the contact point portions 531A against the associated male-side contact portion 332 in the thickness direction L4 of the female-side insulating film 510. As a consequence, the pair of contact point portions 531A sandwich the associated male-side contact portion 332 in the thickness direction L4 of the female-side insulating film 510 (first predetermined direction in claim 5). The linking portion 531C connects the pair of spring portions 531B in a manner continuous therewith. The fixing portion 531D is continuous with the linking portion 531C, and is fixed to the one surface 510A of the female-side insulating film 510. The female-side terminal portion 532 is formed continuously with the fixing portion 531D by extending through the cutout 511. A portion toward the female-side insulating film 510, in a vertical direction as viewed in FIG. 20, of a free end of each contact point portion 531A is formed with an inclined surface 531E. The inclined surface 531E forms a receiving space for the front end of the male-side contact portion 332 when the male connector 301 is in the sliding completion position shown in FIG. 20, and hence it is possible to reduce the dimension of the board-to-board connector 101 in a fitting direction (direction parallel to a thickness direction T1 of the male-side insulating film 310), compared with a contact point portion (not shown) which is not formed with the inclined surface 531E. Note that the inclined surface 531E does not interfere with the front end of the male-side contact portion 332 of the male connector 301 which is in the sliding completion position.

Next, a description will be given of an example of a method of manufacturing the male connector 301 of the board-to-board connector 101 with reference to FIGS. 5 to 12.

Figure 5:
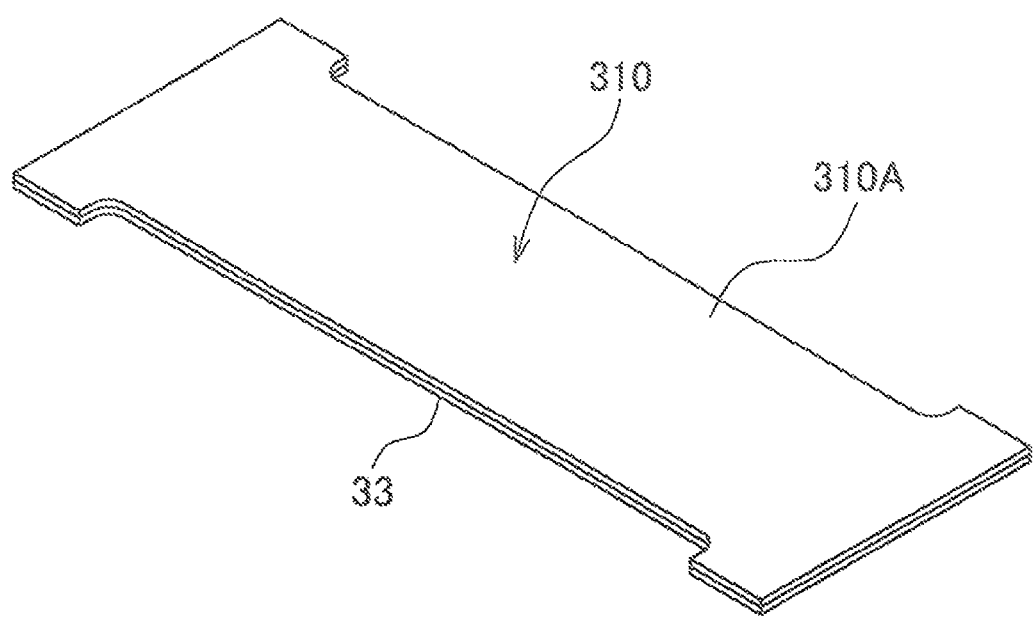
FIG. 5 is a perspective view of a male-side insulating film on which a thin film-processing step has been executed.
Figure 6:
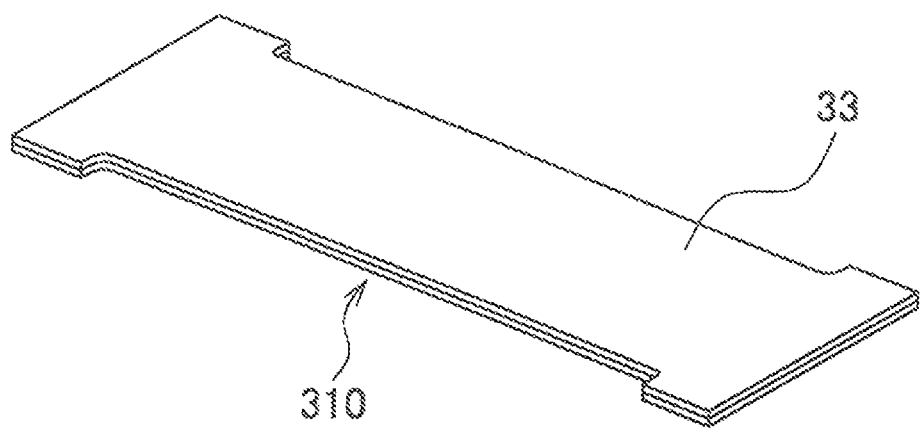
FIG. 6 is a perspective view showing a metal thin film formed on one surface of the male-side insulating film shown in FIG. 5.

First, as shown in FIGS. 5 and 6, a metal thin film 33 is formed on the other surface 310B of the male-side insulating film 310 (thin film-processing step). Methods of forming a thin film include spattering, evaporation coating, and plating. The methods further include one in which the metal thin film 33 formed in advance is affixed to the other surface 310B of the male-side insulating film 310.

Figure 7:
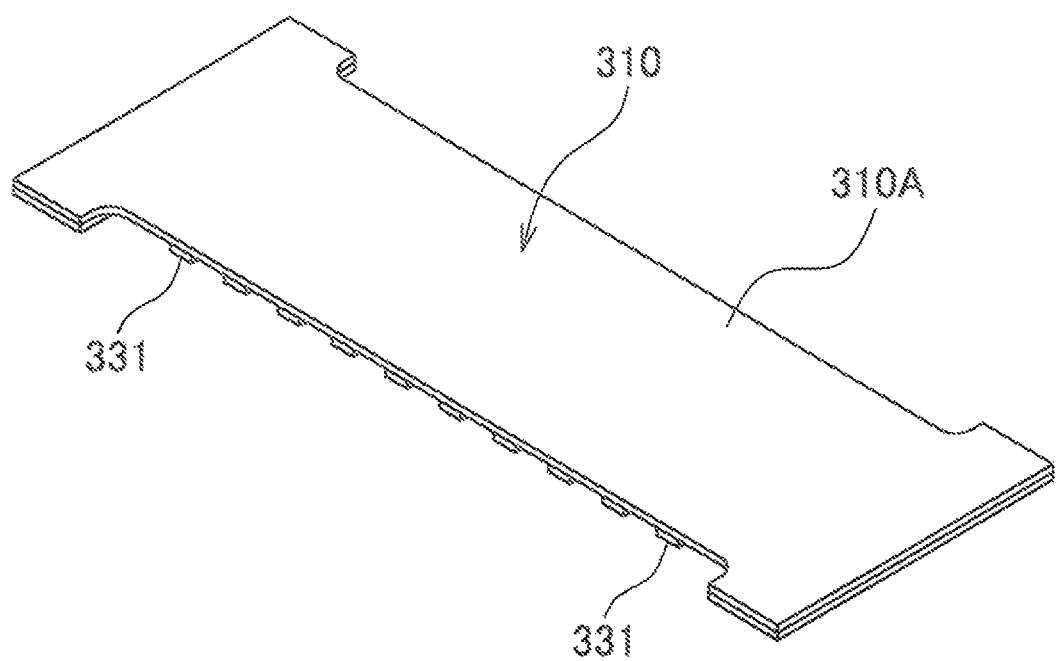
FIG. 7 is a perspective view of the male-side insulating film on which a patterning step has been executed.
Figure 8:
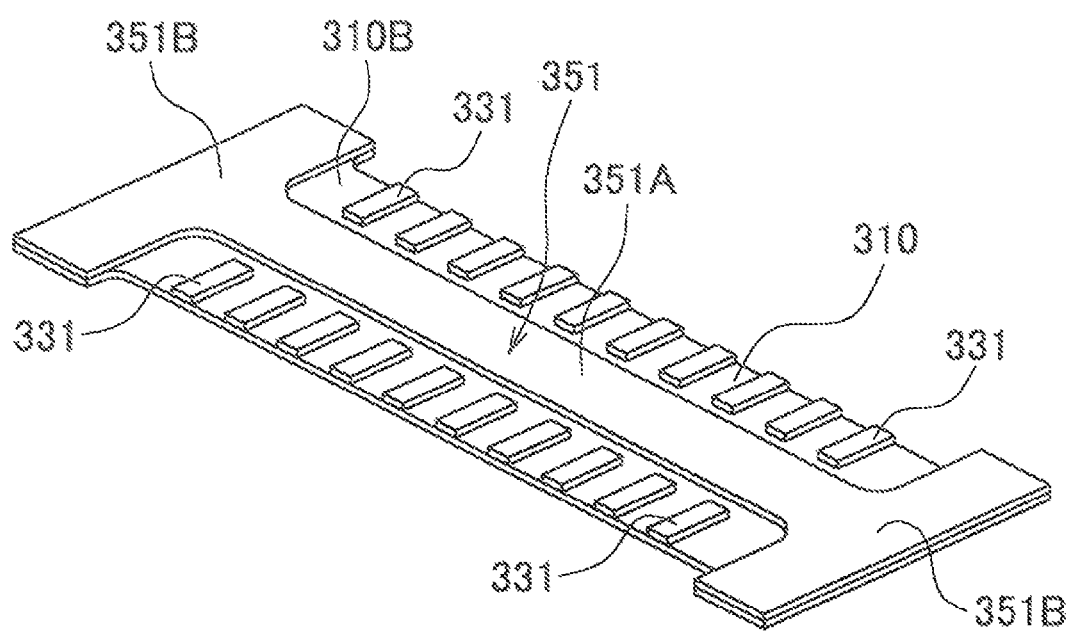
FIG. 8 is a perspective view showing male-side terminal portions formed on the other surface of the male-side insulating film shown in FIG. 7 and a male-side reinforcing member main body.

After execution of the thin film-processing step, the metal thin film 33 is etched to thereby form the plurality of male-side terminal portions 331, the male-side reinforcing member main body portion 351A, and the fixing portions 351B, as shown in FIGS. 7 and 8 (patterning step).

Figure 9:
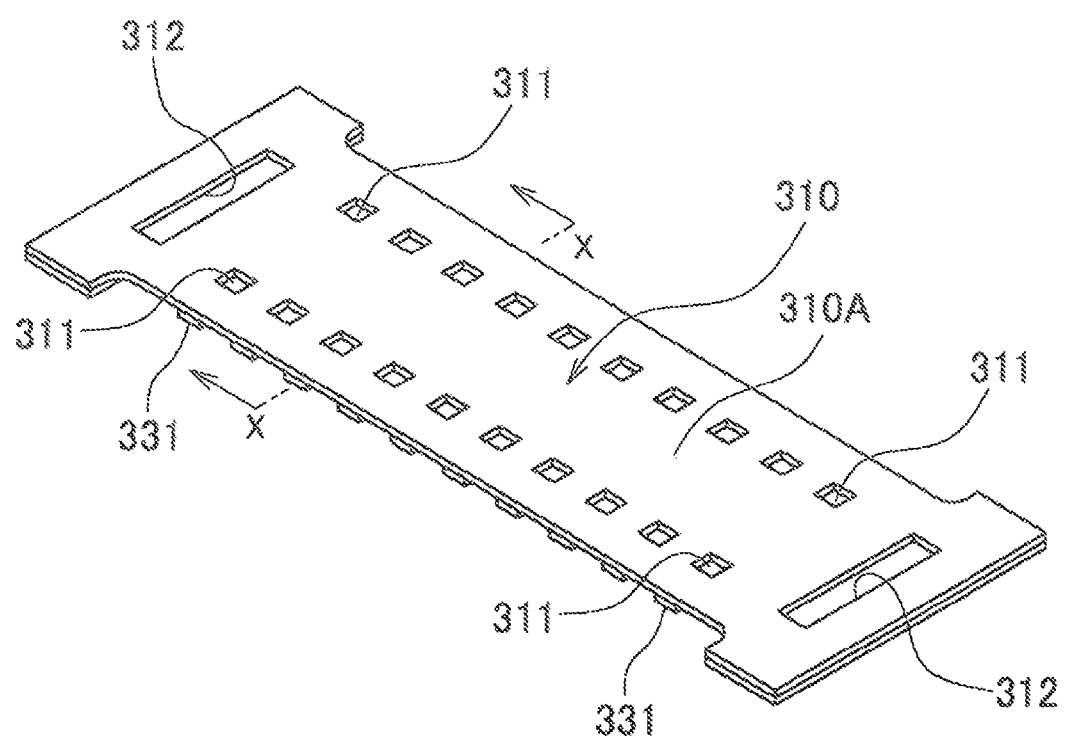
FIG. 9 is a perspective view showing the one surface of the male-side insulating film on which a through hole-forming step has been executed.
Figure 10:
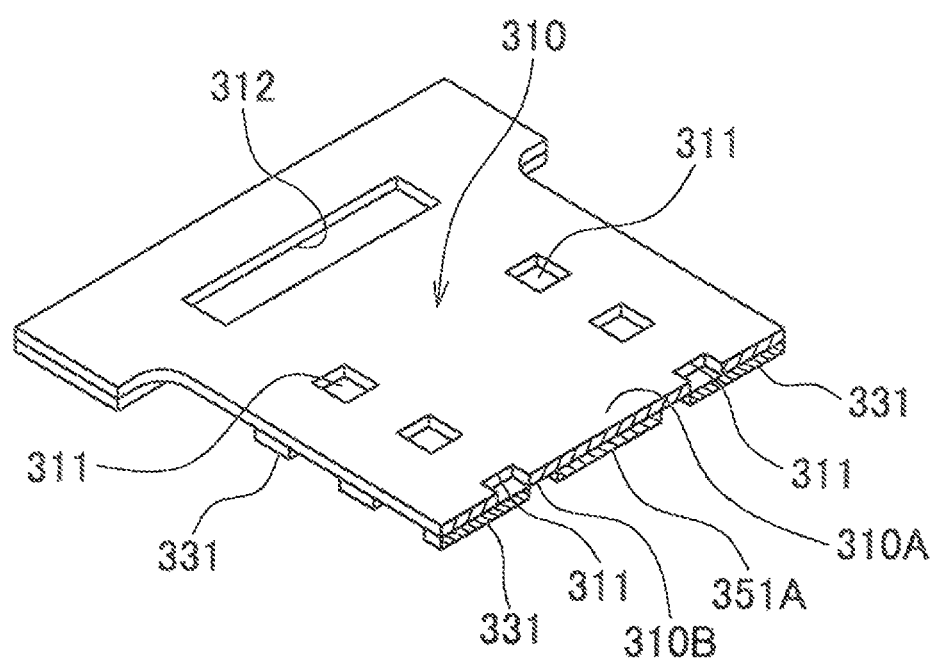
FIG. 10 is a perspective view showing a state cut along X-X in FIG. 9.

After execution of the pattering step, as shown in FIGS. 9 and 10, rectangular through holes 311 which reach the male-side terminal portions 331 are formed through the male-side insulating film 310 by etching processing (through hole-forming step). At this time, rectangular through holes 312 (protruding portion insertion through holes) which reach the fixing portions 351B are simultaneously formed.

Figure 11:
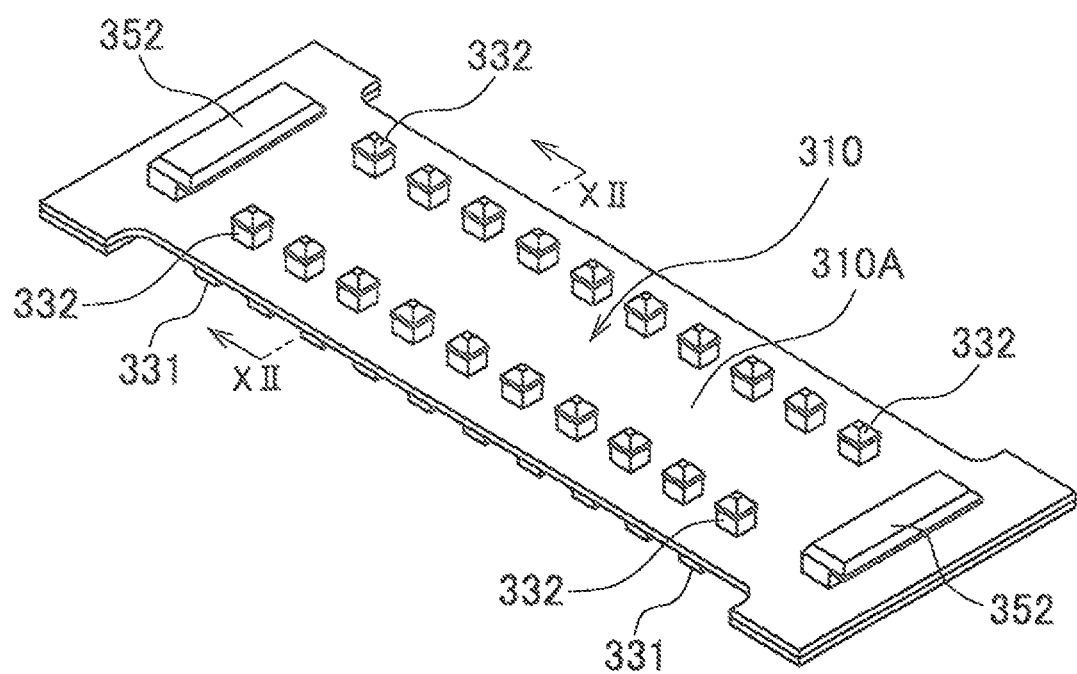
FIG. 11 is a perspective view showing male-side contact portions and protruding portions formed on the one surface of the male-side insulating film on which a contact portion-forming step has been executed.
Figure 12:
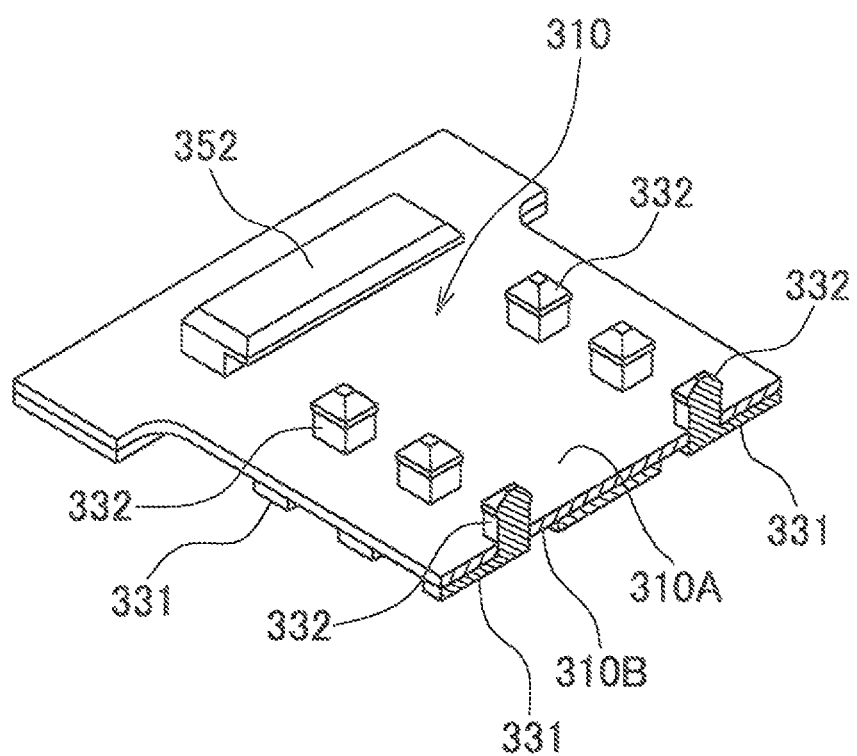
FIG. 12 is a perspective view showing a state cut along XII-XII in FIG. 11.

After execution of the through hole-forming step, as shown in FIGS. 11 and 12, the prism-shaped male-side contact portions 332 are formed at respective locations corresponding to the through holes 311 on the one surface 310A of the male-side insulating film 310, and the protruding portions 352 are formed at respective locations corresponding to the through holes 312 (contact portion-forming step). Methods of forming the male-side contact portion 332 and the protruding portion 352 include a plating method for forming a predetermined shaped object by laminating a plurality of plated layers.

By thus executing the above-described steps, the male side connector 301 is manufactured.

Next, a description will be given of an example of a method of manufacturing the female connector 501 of the board-to-board connector 101 with reference to FIGS. 1, 2, 3, and 4, and the method of manufacturing the male connector 301.

First, a metal thin film is formed on the one surface 510A of the female-side insulating film 510 (thin film-processing step).

After execution of the thin film-processing step, the metal thin film on the one surface 510A of the female-side insulating film 510 is etched to thereby form the plurality of female-side contact portions 531, the protruding portion-supporting members 570, and the first female-side reinforcing member 550 (patterning step).

After execution of the pattering step, the cutouts 511, the through holes 512, the through holes 513, and holddown-forming through holes (not shown) are formed through the female-side insulating film 510 by etching processing (cutout and through hole-forming step). The cutouts 511 and the through holes 512 reach the female-side contact portions 531, respectively.

After execution of the cutout and through hole-forming step, the female-side terminal portions 532 are formed at respective locations corresponding to the cutouts 511 on the other surface 510B of the female-side insulating film 510, and the holddowns 590 are formed at respective locations corresponding to the holddown-forming through holes (terminal portion-forming step).

After execution of the terminal portion-forming step, the second female-side reinforcing member 580 having the through holes 582A and the through holes 582B is affixed to the other surface 510B of the female-side insulating film 510 (affixing step). In doing this, the second female-side reinforcing member 580 is affixed such that the holddowns 590 are accommodated in the through holes 582B, respectively.

Figure 20:
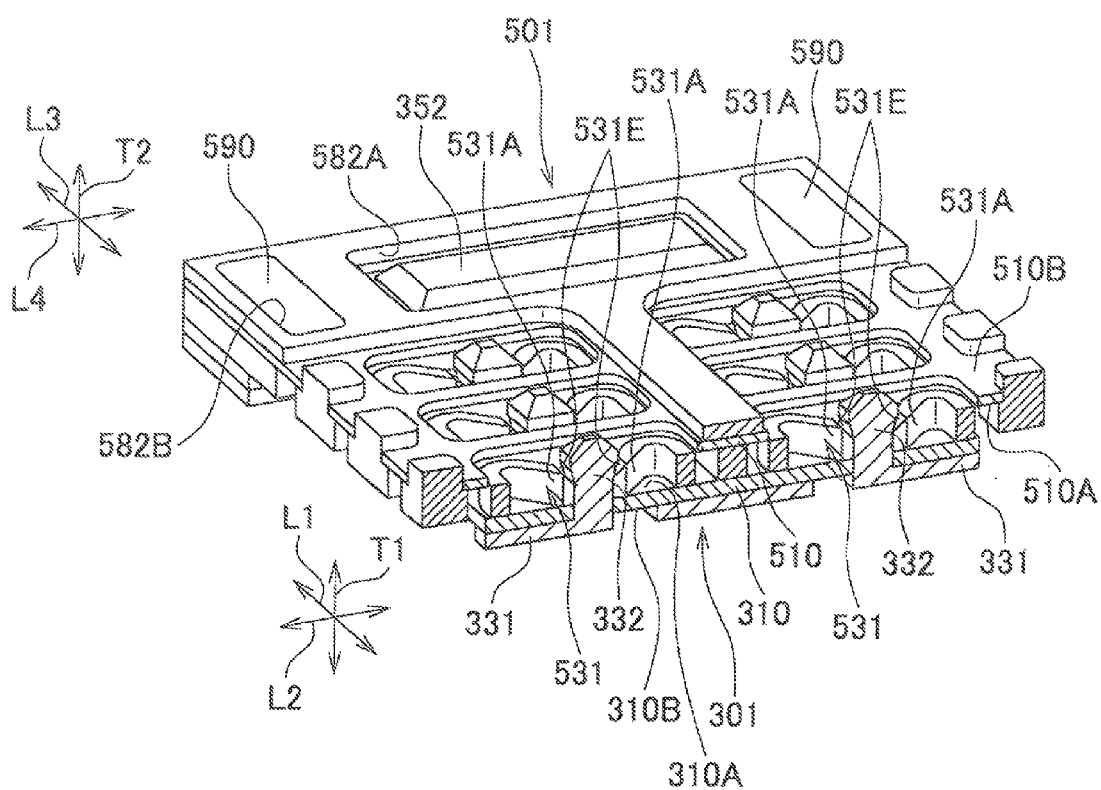
FIG. 20 is a perspective view showing a state cut along XX-XX in FIG. 17.

After execution of the affixing step, the inclined surface 531E is formed by crushing the portion toward the female-side insulating film 510, in the vertical direction as viewed in FIG. 20, of the free end of each contact point portion 531A by press processing (inclined surface-forming step).

The female connector 501 is thus manufactured by execution of the above-described steps.

Next, a description will be given of an operation for fitting the female connector 501 and the male connector 301 with reference to FIGS. 1, and 13 to 20.

Figure 13:
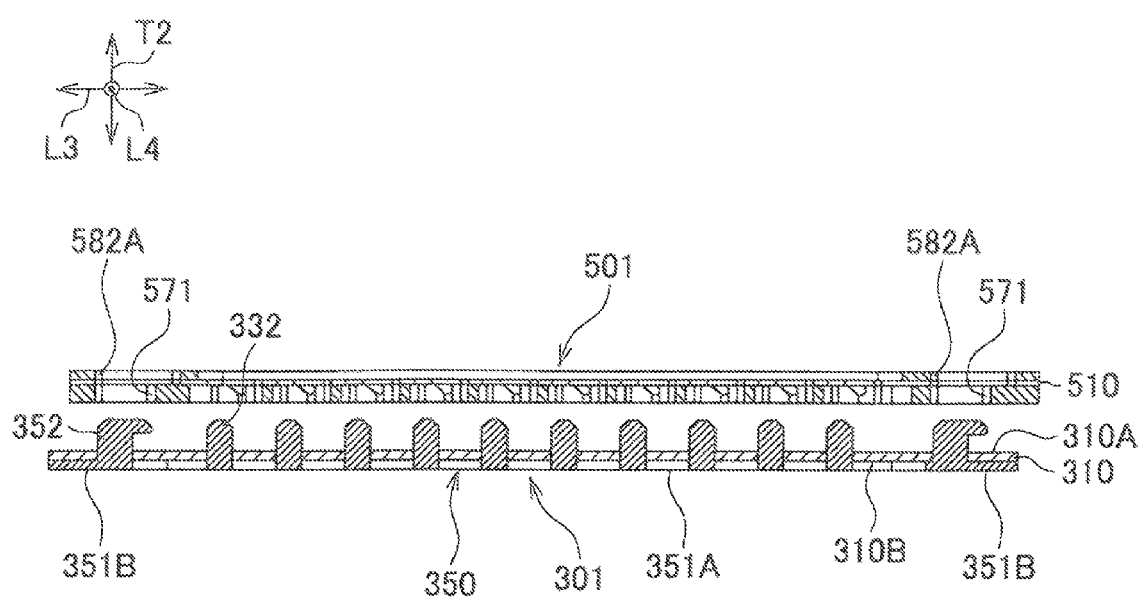
FIG. 13 is a cross-sectional view taken along XIII-XIII in FIG. 1.
Figure 14:
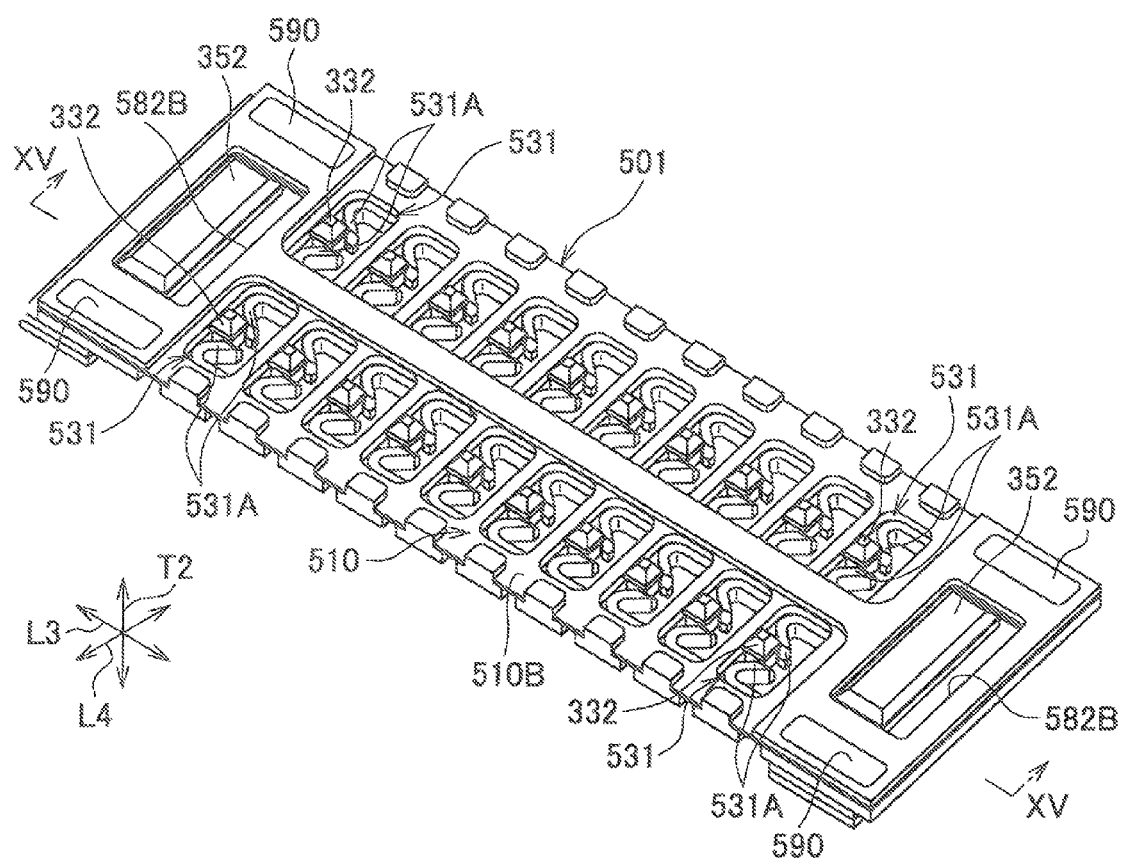
FIG. 14 is a perspective view showing a state in which the male connector has been fitted to the female connector, and the male connector is in a protruding portion insertion completion position.
Figure 15:
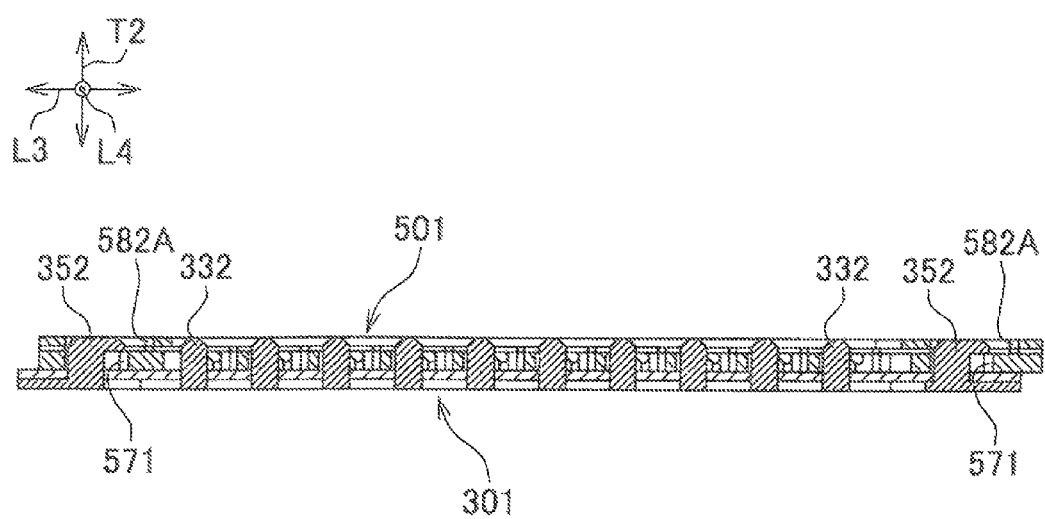
FIG. 15 is a cross-sectional view taken along XV-XV in FIG. 14.
Figure 16:
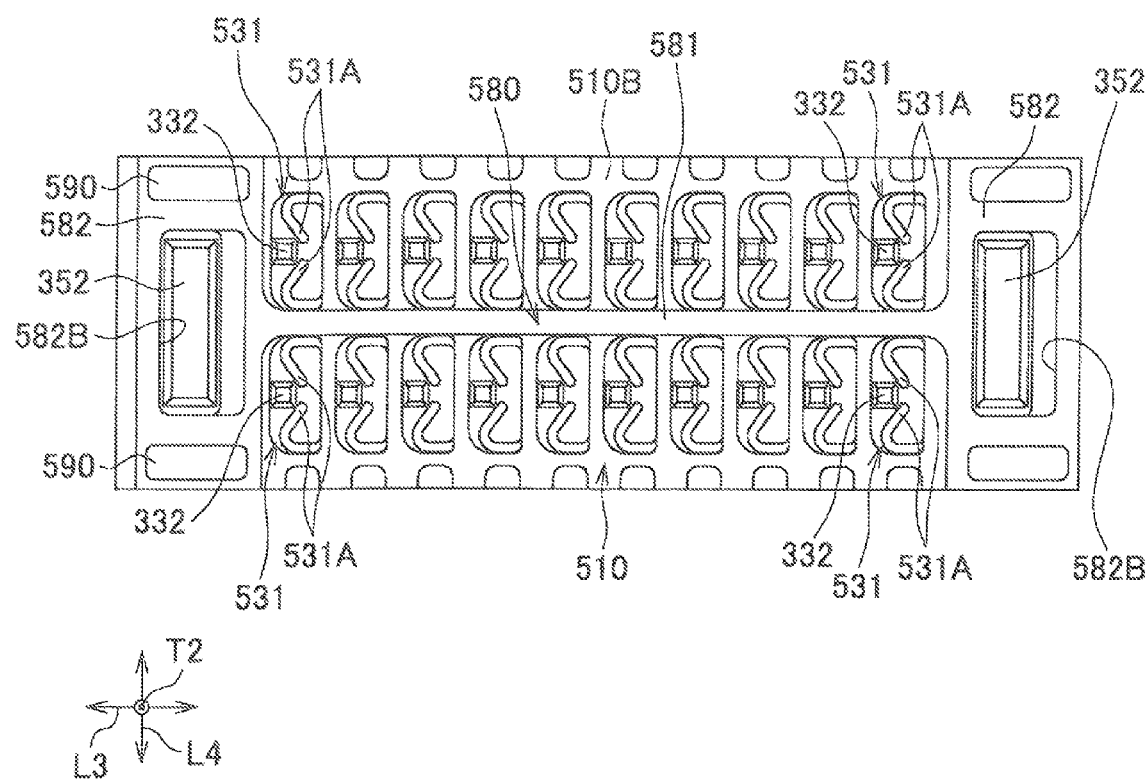
FIG. 16 is a view of the board-to-board connector shown in FIG. 14, as viewed from a mounting surface side of the female connector.
Figure 17:
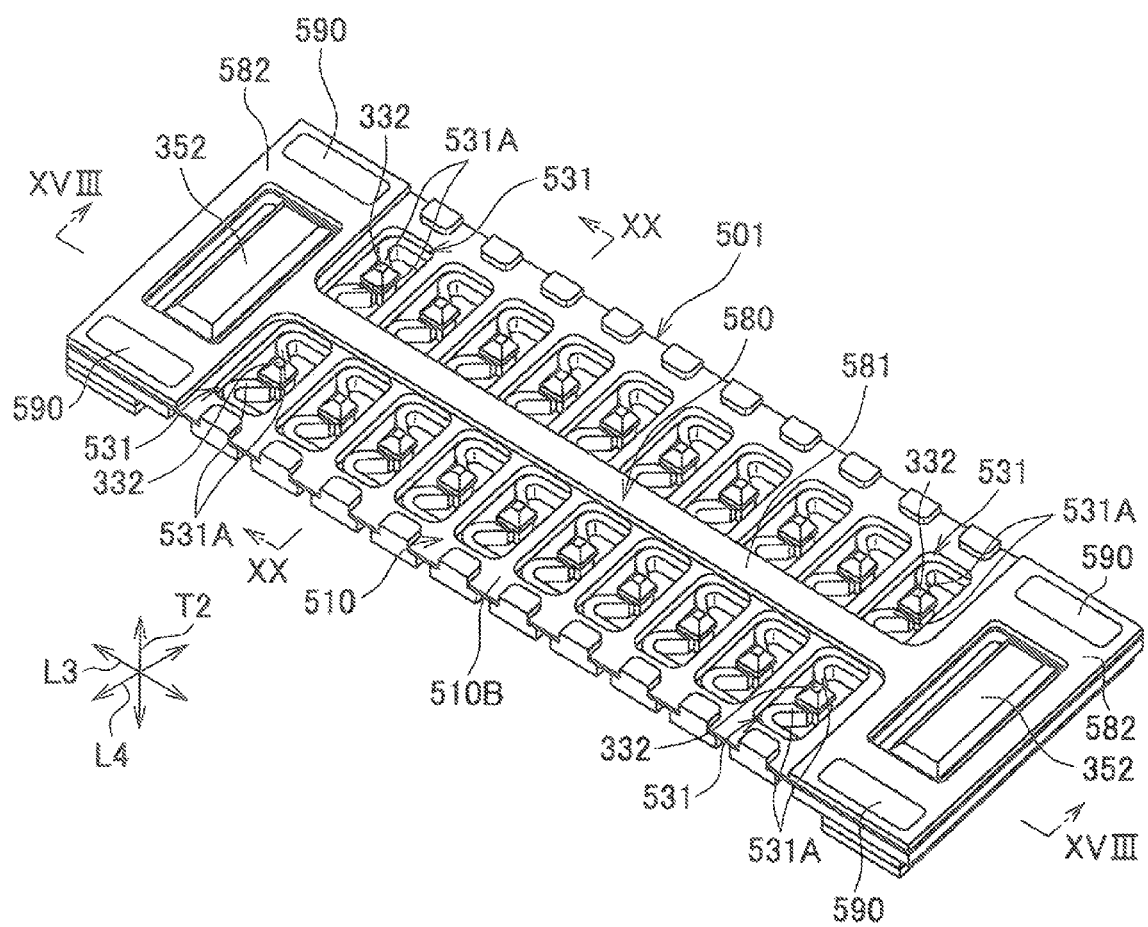
FIG. 17 is a perspective view showing a state in which the male connector has been slid from the protruding portion insertion completion position to a sliding completion position.

First, as shown in FIGS. 1 and 13, the female connector 501 and the male connector 301 are arranged opposed to each other, and then, the male connector 301 is relatively moved up in the thickness direction T2 to the female-side insulating film 510 to thereby fit the male connector 301 to the female connector 501 as shown in FIGS. 14, 15, and 16. At this time, the protruding portions 352 are inserted in the protruding portion-receiving holes 571 and the through holes 582A of the female connector 501, respectively. Further, each of the male-side contact portions 332 of the male connector 301 is inserted between the pair of contact point portions 531A of an associated one of the female-side contact portions 531 (see FIG. 14). At this time, the spring portions 531B are hardly elastically deformed. Note that the position of the male connector 301 when the protruding portions 352 have been inserted in the protruding portion-receiving holes 571 is the protruding portion insertion completion position (see FIG. 16).

Next, the male connector 301 is relatively slid in the longitudinal direction L3 of the female-side insulating film 510 from the protruding portion insertion completion position shown in FIG. 16 to the sliding completion position (see FIGS. 17, 18, and 19) in which each female-side contact portion 531 is elastically deformed to sandwich the male-side contact portion 332 between the pair of contact point portions 531A thereof in the width direction L4 of the female-side insulating film 510, whereby a predetermined contact force is generated between the female-side contact portion 531 and the male-side contact portion 332.

As a result, the male-side contact portion 332 is sandwiched by the pair of contact point portions 531A in the width direction L4 of the female-side insulating film 510.

At this time, as shown in FIG. 20, the contact point portions 531A of each female-side contact portion 531 are in a position sandwiched by the front end portion of the male-side contact portion 332 and the male-side insulating film 310 in the thickness direction T1 of the male-side insulating film 310, and hence the male connector 301 and the female connector 501 are prevented from being detached from each other.

According to the present embodiment, since the prism-shaped male-side contact portions 332 protrude from the one surface 310A of the male-side insulating film 310, and the male-side terminal portions 331 are arranged on the other surface 310B of the male-side insulating film 310, it is possible to prevent each male-side contact 330 from short-circuiting adjacent ones of the female-side contacts 530.

Further, since it is possible to prevent a short-circuit from occurring between the adjacent female-side contacts 530, it is possible to reduce the arrangement pitch of the male-side contact portions 332 and the female-side contact portions 531, and thereby reduce the size of the board-to-board connector 101.

To reduce possibility of occurrence of a short-circuit in the above-described conventional board-to-board connector, it is only necessary to form a gap between the conductor traces 951 and the auxiliary conductors 1152 in the fitting direction. However, this causes a problem that the board-to-board connector is increased in height. To solve this problem, according to the present embodiment, since the male-side terminal portions 331 are arranged on the other surface 310B of the male-side insulating film 310, the female-side contact portions 531 are prevented from being brought into contact with the male-side terminal portions 331. Therefore, the female-side contact portions 531 may be brought into contact with the one surface 310A of the male-side insulating film 310, which makes it possible to reduce the board-to-board connector 101 in height.

Further, in the present embodiment, both of the male-side contact portions 332 and the male-side terminal portions 331 are not arranged on the one surface 310A of the male-side insulating film 310, but only the male-side contact portions 332 are arranged on the one surface 310A of the male-side insulating film 310, and hence it is possible to make the fitting stroke of the male-side contact portion 332 to the female-side contact portion 531 larger than that in the above-described conventional board-to-board connector, which improves contact stability.

Further, in the above-described conventional board-to-board connector, the sliding direction (locking direction C) of the male connector 901 relative to the female connector 1101 and the direction in which the contact portion 1153A3 of the main arm portion 1153A and the contact portion 1153B3 of the auxiliary arm portion 1153B of the reception terminal 1153 of each female conductor 1151 sandwich the protruding terminal 953 are parallel to each other, and hence when the protruding terminal 953 is in a state sandwiched by the contact portion 1153A3 of the main arm portion 1153A and the contact portion 1153B3 of the auxiliary arm portion 1153B of the reception terminal 1153 of each female conductor 1151, if some force acts on the board-to-board connector to cause the male connector 901 to be displaced in the sliding direction relative to the female connector 1101, the protruding terminal 953 is brought into strong contact with the auxiliary arm portion 1153B as a component part of the reception terminal 1153, causing deformation of the auxiliary arm portion 1153B, and this may cause a problem that the contact stability between the protruding terminal 953 of the male connector 901 and the reception terminal 1153 of the female connector 1101 cannot be maintained. On the other hand, in the present embodiment, the direction of sliding the male connector 301 relative to the female connector 501 and the direction in which the pair of contact point portions 531A sandwich the male-side contact portion 332 is orthogonal to each other, and hence when the male-side contact portion 332 is in a state sandwiched by the pair of contact point portions 531A, even if some force acts on the board-to-board connector to cause the male connector 301 to be displaced along the sliding direction relative to the female connector 501, no significant change in load is caused in a spring-bending direction, which prevents the spring portions 531B from being bent, and hence the force of the pair of contact point portions 531A for sandwiching the male-side contact portion 332 hardly changes, so that the contact stability between the male-side contact 330 and the female-side contact 530 is maintained.

Further, since the male-side terminal portions 331 are arranged on the other surface 310B of the male-side insulating film 310, when the male connector 301 is mounted on the first substrate, the male-side terminal portions 331 are directly arranged on the pad of the first substrate, without such a large gap between each tale portion 958 and the associated pad of the first substrate forming as in the above-described conventional board-to-board connector. Therefore, it is possible to positively and easily solder the male-side terminal portions 331 to the pads of the first substrate.

Further, since it is possible to simultaneously form the male-side reinforcing member main body portion 351A and the fixing portions 351B when forming the male-side terminal portions 331, the board-to-board connector according to the present embodiment can be manufactured more easily than the above-described conventional board-to-board connector.

Further, the male connector 301 does not use stainless as its material, and the number of materials of the board-to-board connector according to the invention is one smaller than that of materials of the above-described conventional board-to-board connector, and hence it is easy to reduce the costs.

Figure 21:
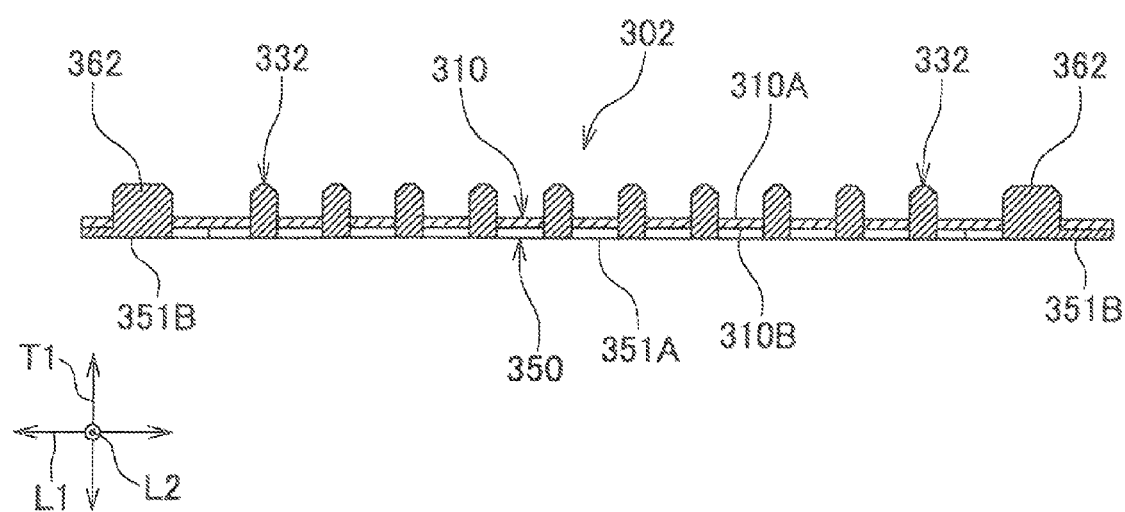
FIG. 21 is a cross-sectional view of a male connector of a board-to-board connector according to a second embodiment of the present invention.

Next, a description will be given of a male connector 302 of a board-to-board connector according to a second embodiment of the present invention with reference to FIG. 21.

Component parts identical to those of the connector according to the first embodiment are denoted by identical reference numerals, and detailed description thereof is omitted, while only main component parts different in construction from those of the first embodiment will be described hereafter.

The male connector 302 of the board-to-board connector according to the second embodiment is a connector of a type which is not slid after being fitted. The male connector 302 differs from the male connector 301 of the board-to-board connector 101 of the first embodiment in the shape of protruding portions 362 of the male-side reinforcing member. Note that the male-side contact portion 332 of the second embodiment may be made longer (larger) in width in the longitudinal direction L1 of the male-side insulating film 310 than the male-side contact portion 332 of the first embodiment.

Each protruding portion 362 of the male connector 302 has no component corresponding to the holding portion 352B of the board-to-board connector 101 of the first embodiment. The length of the protruding portion 362 in the longitudinal direction L1 of the male side insulting film 310 is equal to the length of the holding portion 352B of the protruding portion 352 of the male connector 301 of the first embodiment (length of the holding portion 352B in the longitudinal direction L1 of the male side insulting film 310). However, the location of the protruding portion 362 is shifted leftward, as viewed in FIG. 21, by an amount corresponding to a difference in length between the protruding portion main body 352A and the holding portion 352B in the longitudinal direction L1 of the male side insulting film 310 of the male connector 301.

Since the male connector 302 is not slid after being fitted to the female connector 501, the male connector 302 is not locked in the thickness direction T2 of the female-side insulating film 510, but the female-side contact portion 531 is sandwiched by the front end portion of the male-side contact portion 332 and the male-side insulating film 310 in the thickness direction T1 of the male-side insulating film 310, and hence the male connector 302 is difficult to be removed from the female connector 501. When the protruding portions 362 are inserted in the through holes 582A of the female connector 501, respectively, the female-side contact portion 531 is elastically deformed to sandwich the male-side contact portion 332 between the pair of contact point portions 531A thereof in the width direction L4 of the female-side insulating film 510 (predetermined direction orthogonal to the thickness direction T2 of the of the female-side insulating film 510), whereby a predetermined contact force is generated between the female-side contact portion 531 and the male-side contact portion 332.

As a mating female connector of the male connector 302, the female connector 501 of the board-to-board connector 101 of the first embodiment can be used as it is.

According to the present embodiment, it is possible to position the male connector 302 with respect to the female connector 501. Further, it is possible to fit and remove the male connector 302 to and from the female connector 501 by one operation.

Next, a description will be given of an example of a method of manufacturing a male connector 601 of a board-to-board connector according to a third embodiment of the present invention with reference to FIGS. 22 to 27. The male connector 601 is a connector of a type which is not slid after being fitted to the female connector.

Figure 22:
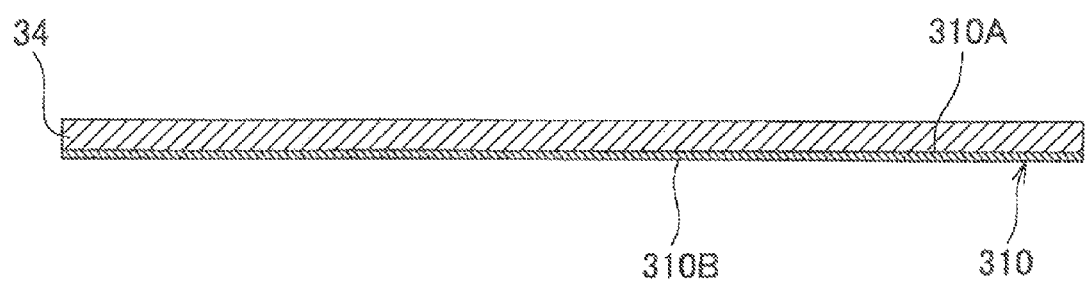
FIG. 22 is a cross-sectional view useful in explaining a method of manufacturing a male connector of a board-to-board connector according to a third embodiment of the present invention, in a state in which a contact portion-side metal thin film has been formed on one surface of a male-side insulating film in a contact portion-side thin film-processing step.

First, as shown in FIG. 22, a contact portion-side metal thin film 34 is provided on the one surface 310A of the male-side insulating film 310 (contact portion-side thin film-processing step).

Figure 23:
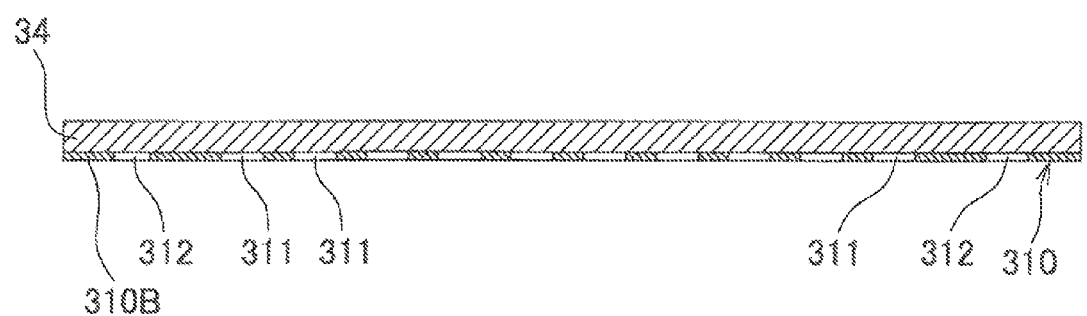
FIG. 23 is a cross-sectional view showing a state in which through holes reaching the contact portion-side metal thin film and through holes for the protruding portions have been formed through the male-side insulating film in a through hole-forming step after execution of the contact portion-side thin film-processing step.

After execution of the contact portion-side thin film-processing step, as shown in FIG. 23, the through holes 311 circular in shape and the through holes rectangular in shape (protruding portion insertion through holes) 312, which reach the contact portion-side metal thin film 34, are formed through the male-side insulating film 310 by etching processing (through hole-forming step).

Figure 24:
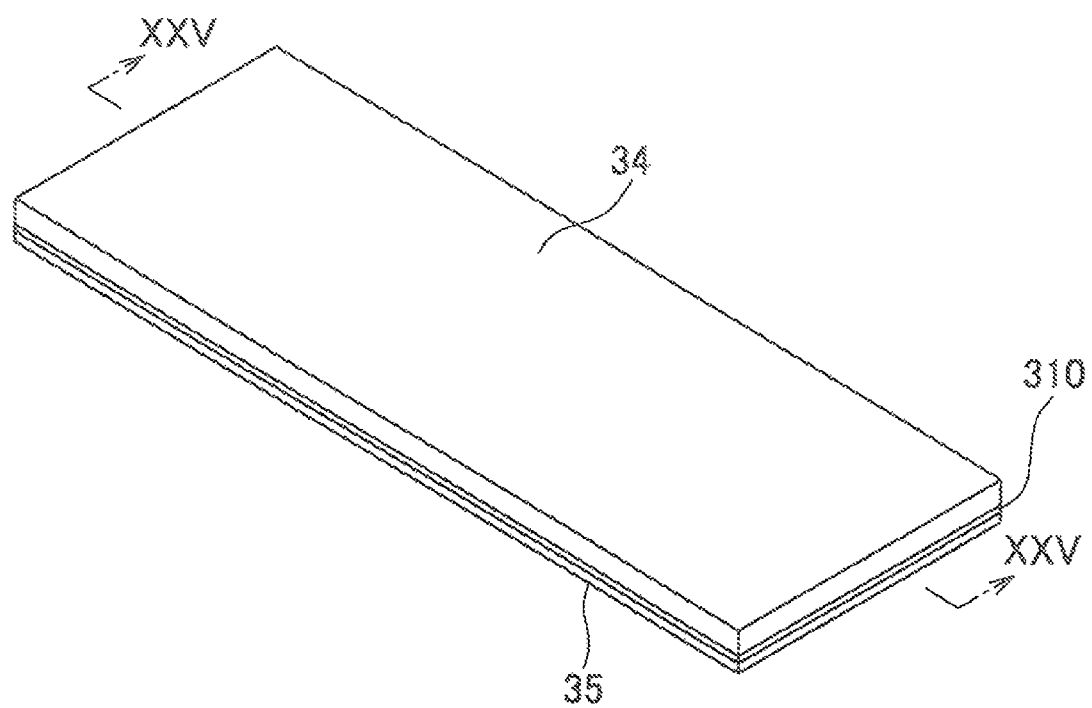
FIG. 24 is a perspective view showing a state in which a terminal portion-side metal thin film has been formed on the other surface of the insulating film in a terminal portion-side thin film-processing step.
Figure 25:
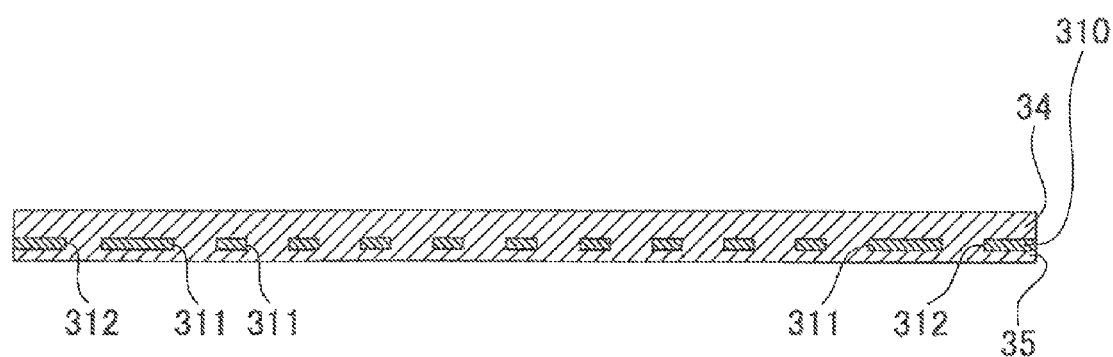
FIG. 25 is a cross-sectional view taken along XXV-XXV in FIG. 24.

After execution of the through hole-forming step, as shown in FIGS. 24 and 25, a terminal portion-side metal thin film 35 is provided on the other surface 310B of the male-side insulating film 310 e.g. by plating (terminal portion-side thin film-processing step).

Figure 26:
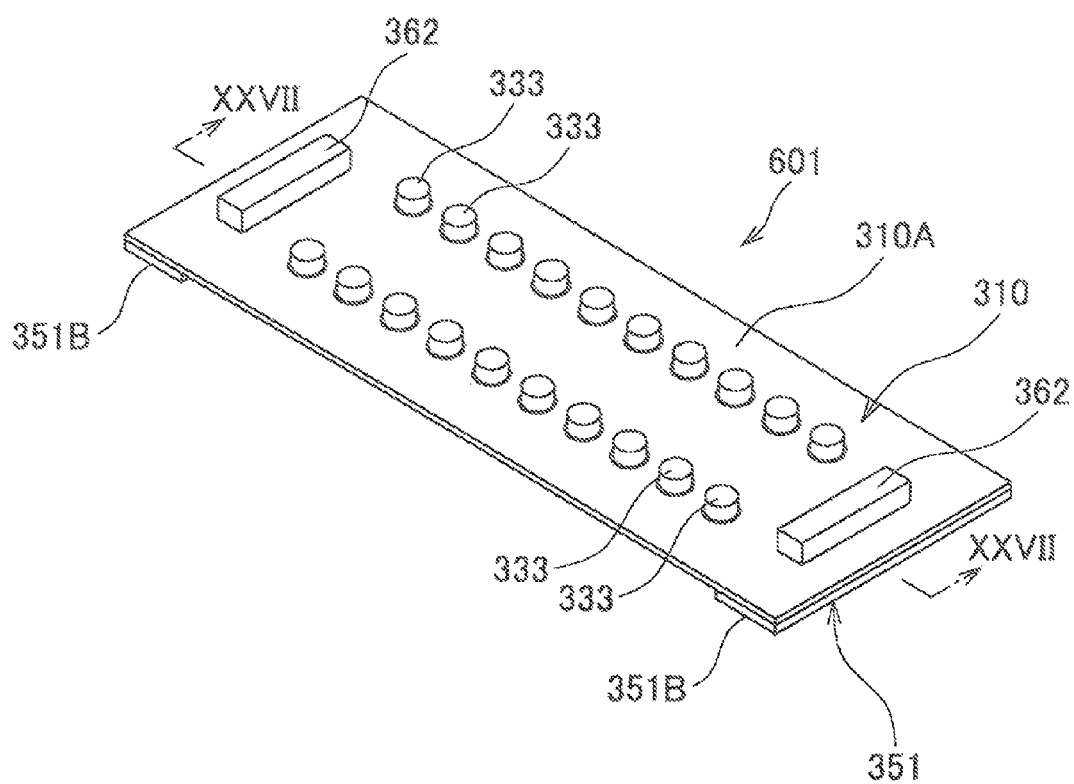
FIG. 26 is a perspective view showing a state in which in the patterning step after execution of the terminal portion-side thin film-processing step, the contact portion-side metal thin film has been etched to form the male-side contact portions at respective locations corresponding to the through holes and the protruding portions at respective locations corresponding to the protruding portion insertion through holes, and the terminal portion-side metal thin film has been etched to form the male-side terminal portions, the male-side reinforcing member main body, and fixing portions.
Figure 27:
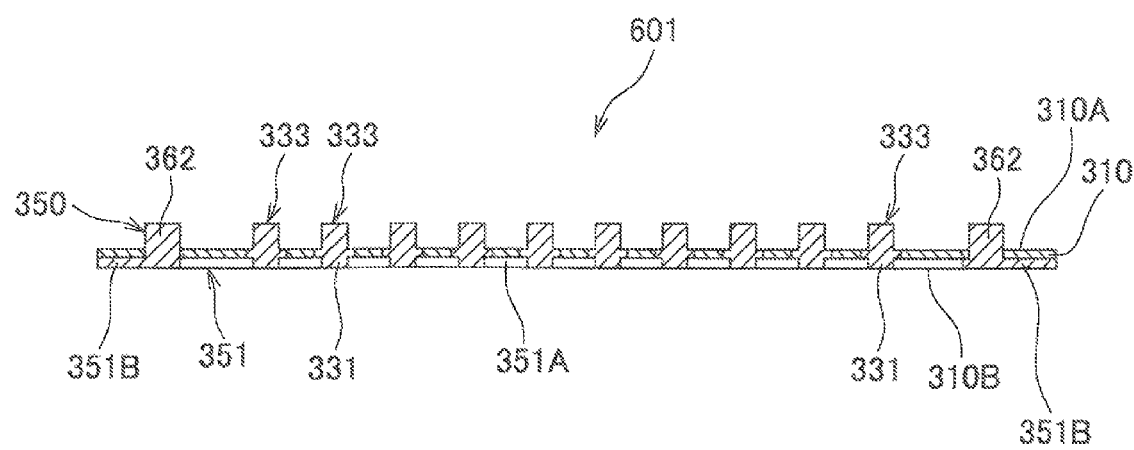
FIG. 27 is a cross-sectional view taken along XXVII-XXVII in FIG. 26.
Figure 28:
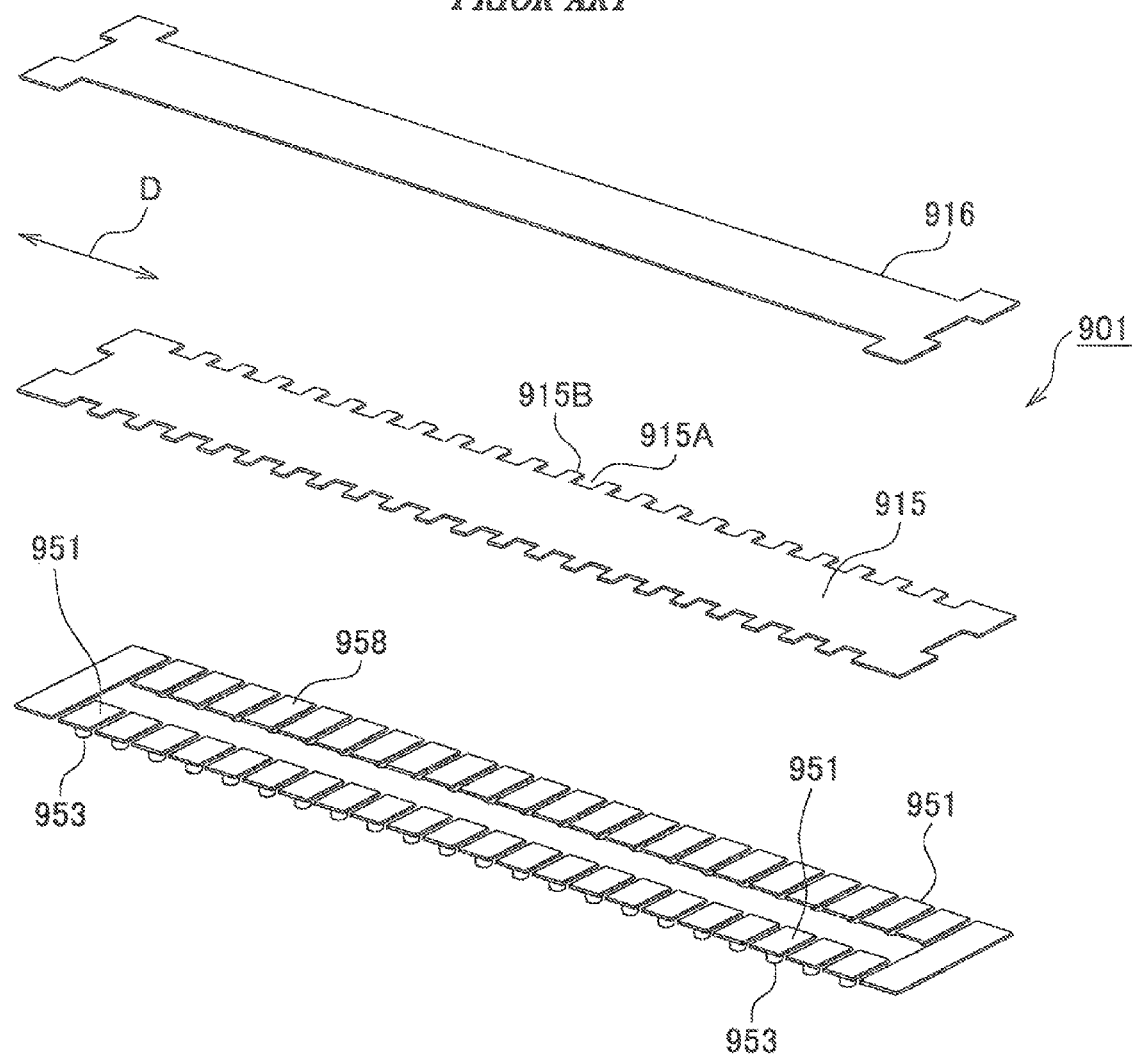
FIG. 28 is an exploded perspective view of a male connector of a conventional board-to-board connector.
Figure 29:
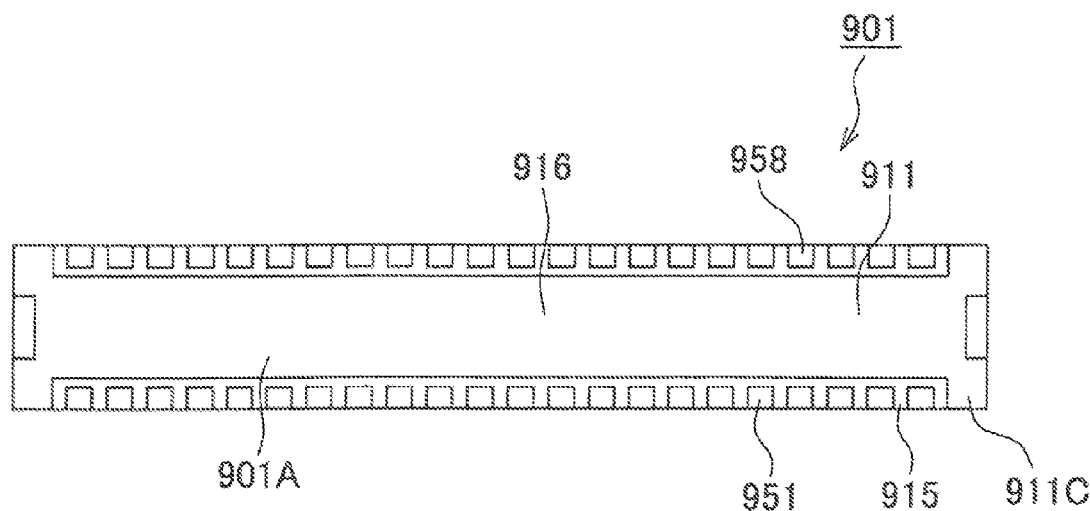
FIG. 29 is a plan view of the male connector shown in FIG. 28.
Figure 30:
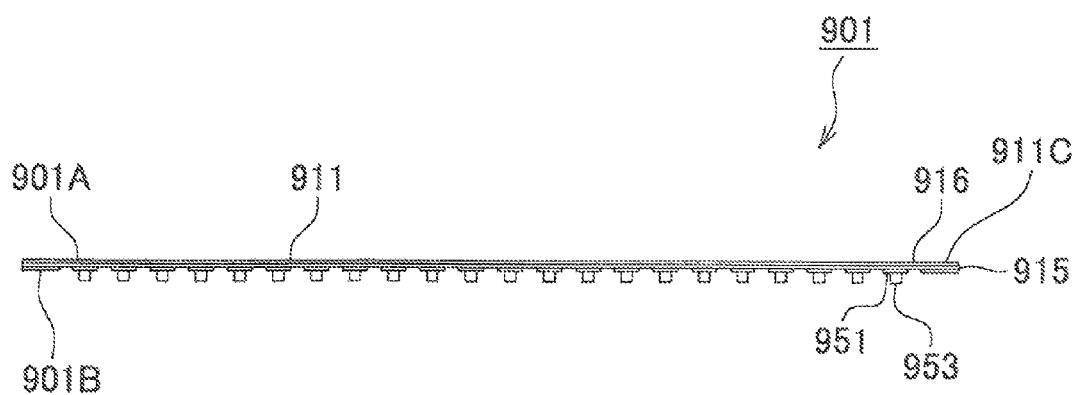
FIG. 30 is a front view of the male connector shown in FIG. 28.
Figure 31:
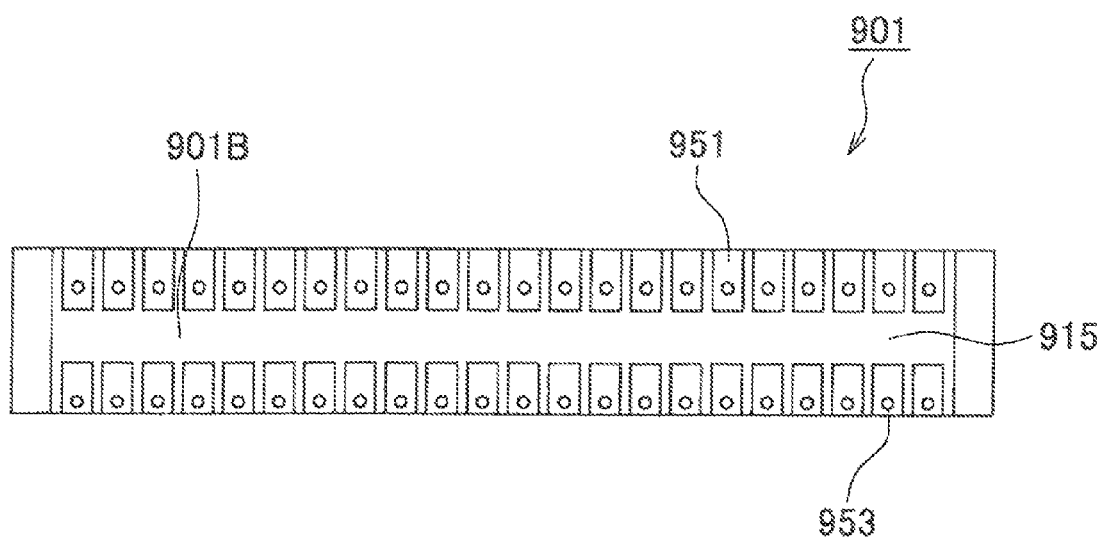
FIG. 31 is a bottom view of the male connector shown in FIG. 28.
Figure 32:
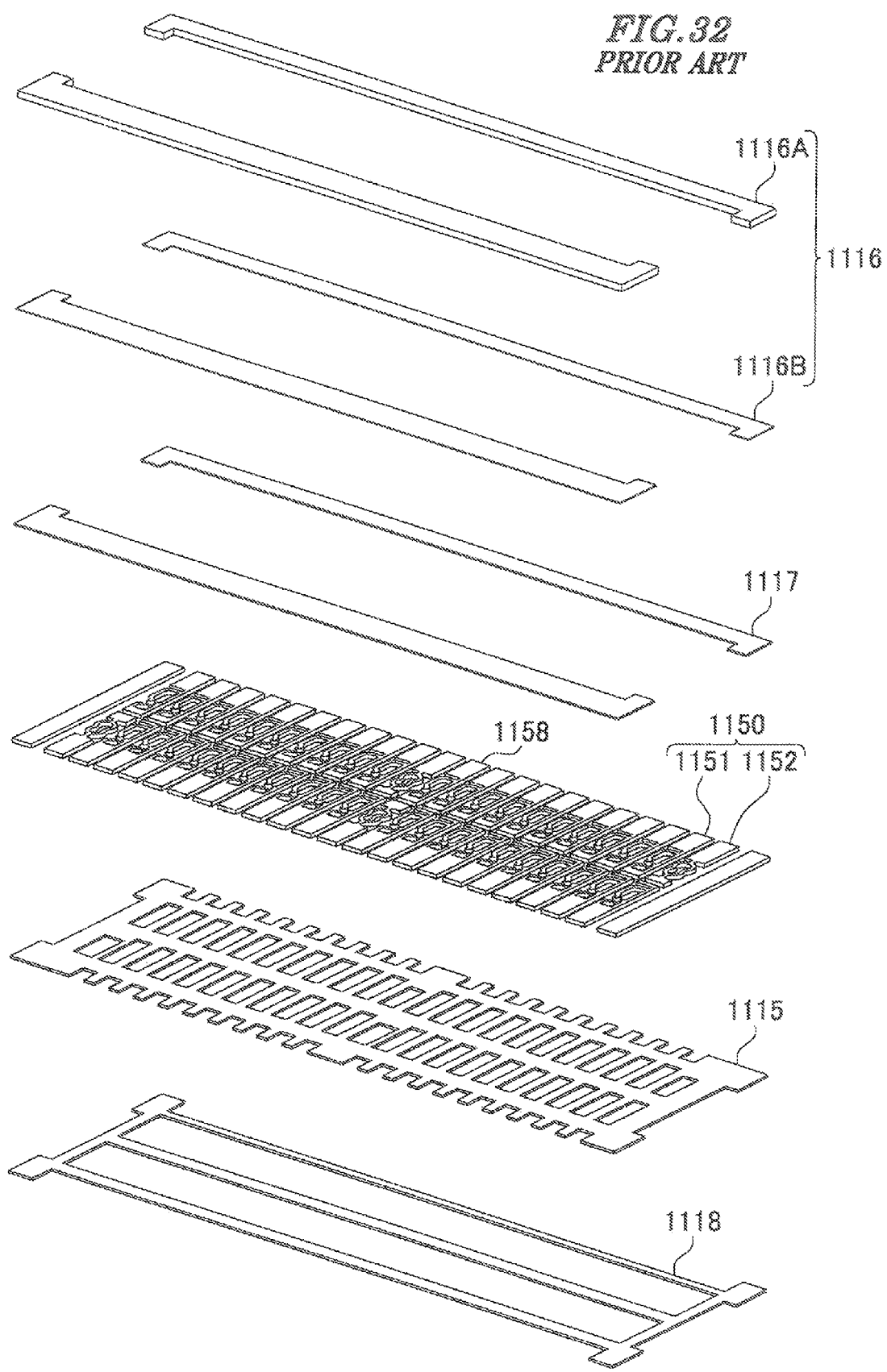
FIG. 32 is an exploded perspective view of a female connector of the conventional board-to-board connector.
Figure 33:
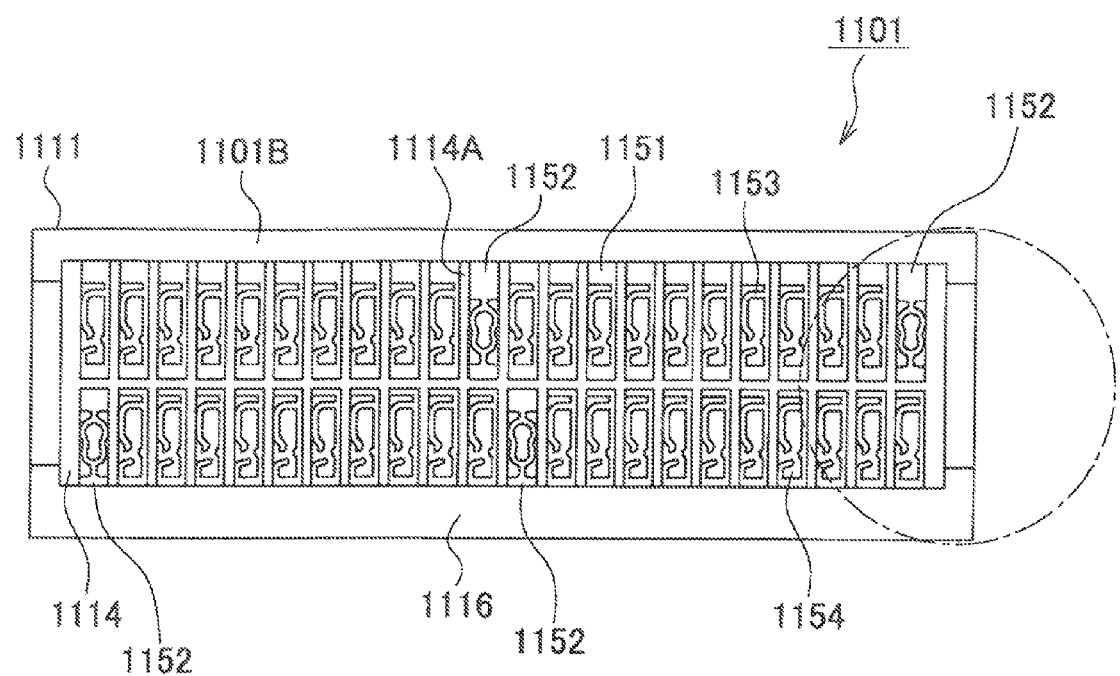
FIG. 33 is a plan view of the female connector shown in FIG. 32.
Figure 34:
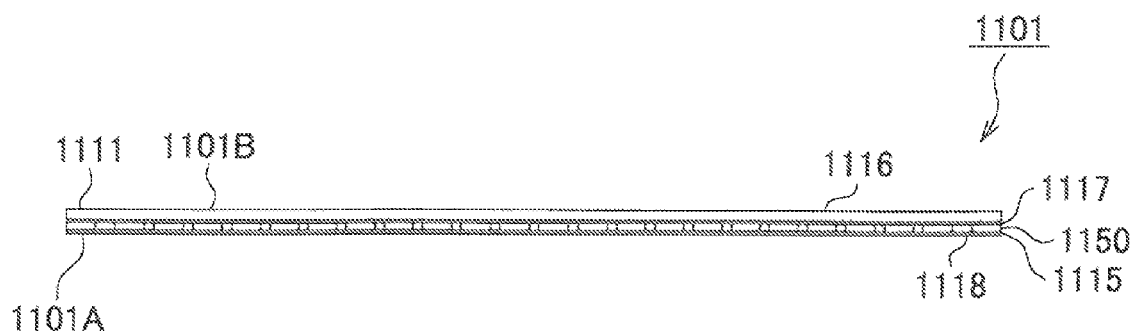
FIG. 34 is a front view of the female connector shown in FIG. 32.
Figure 35:
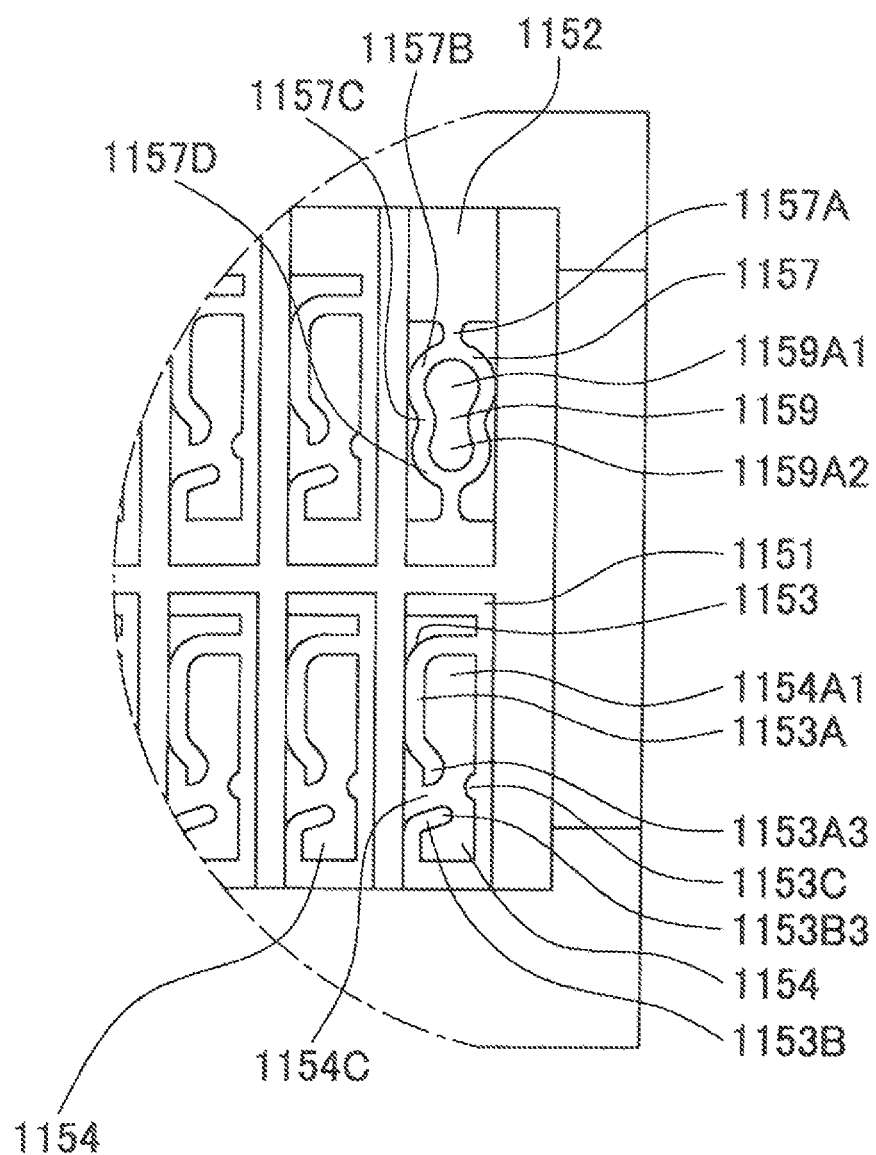
FIG. 35 is an enlarged view of essential parts of the female connector shown in FIG. 32.
Figure 36:
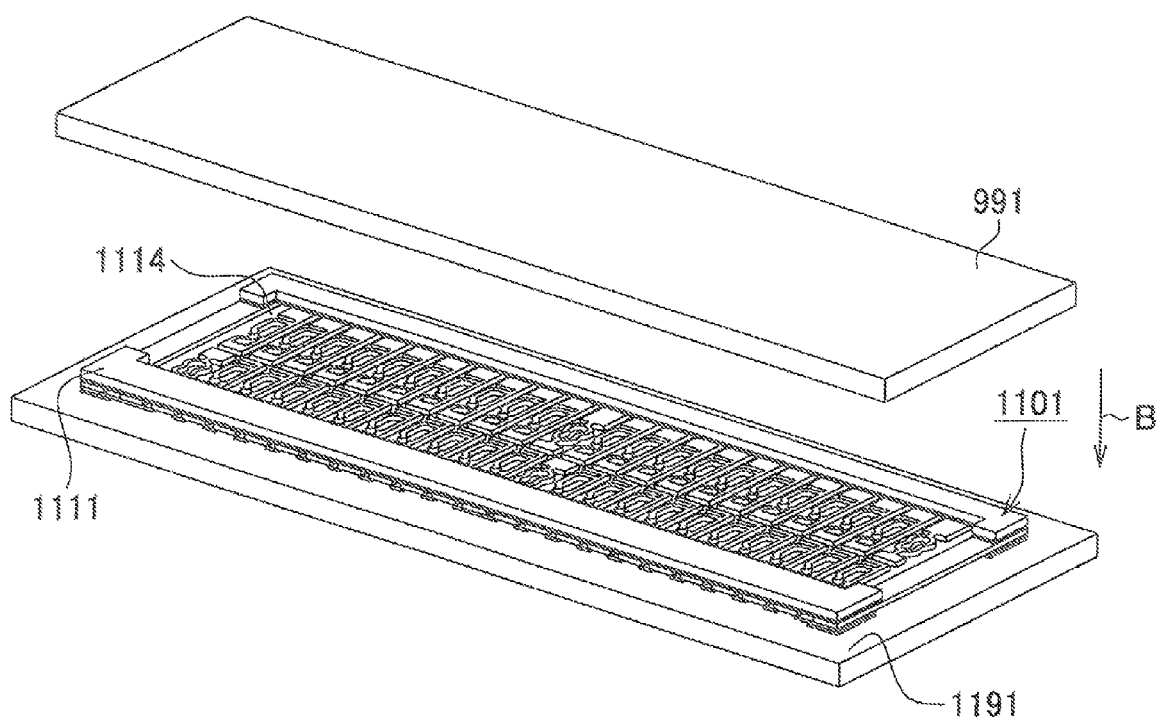
FIG. 36 is a perspective view showing a state in which the male connector and the female connector are opposed to each other, which is useful in explaining a step in which the male connector shown in FIG. 28 and the female connector shown in FIG. 32 are fitted to each other
Figure 37:
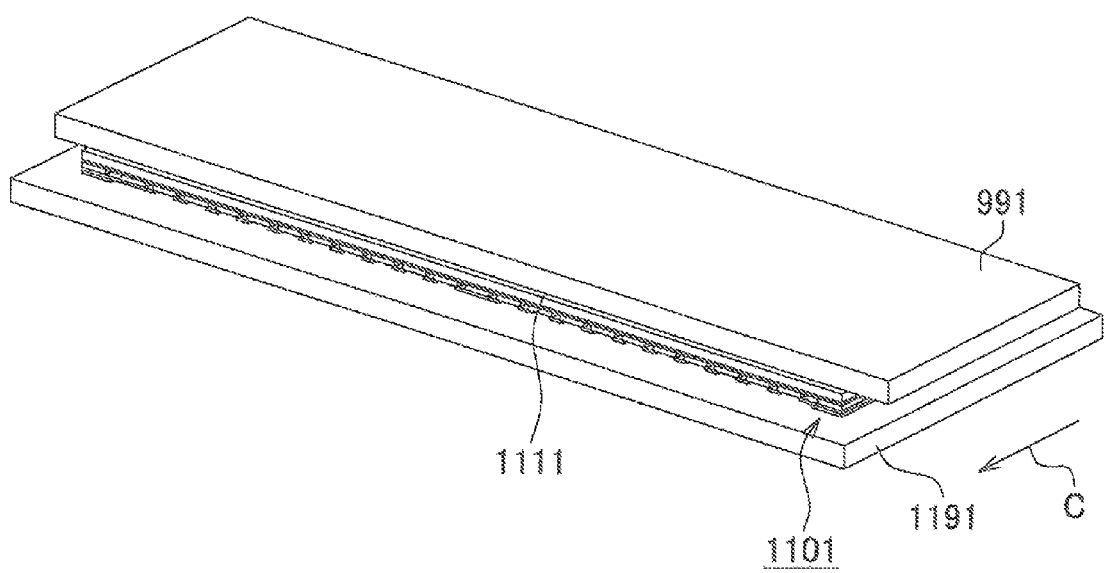
FIG. 37 is a perspective view showing a state in which the male connector and the female connector are being fitted to each other, which is useful in explaining the step in which the male connector shown in FIG. 28 and the female connector shown in FIG. 32 are fitted to each other.
Figure 38:
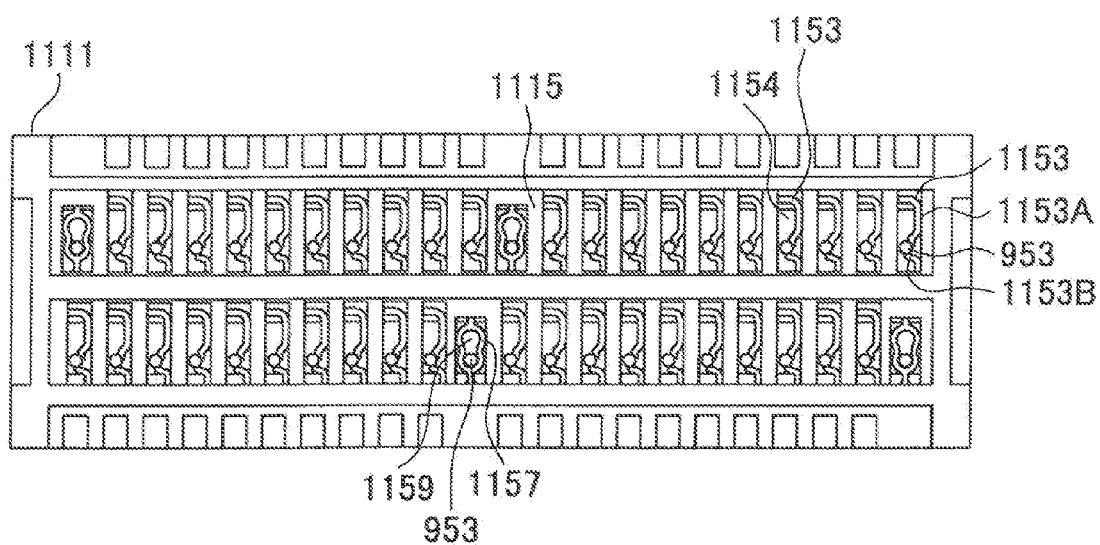
FIG. 38 is a bottom view showing a state in which the male connector shown in FIG. 28 and the female connector shown in FIG. 32 have been fitted to each other.

After execution of the terminal portion-side thin film-processing step, the contact portion-side metal thin film 3 is etched to thereby form cylindrical (pin-shaped) male-side contact portions 333 at respective locations corresponding to the through holes 311 and the protruding portions 362 at respective locations corresponding to the through holes 312, and the terminal portion-side metal thin film 35 is etched to thereby form the male-side terminal portions 331, the male-side reinforcing member main body portion 351A, and the fixing portions 351B, as shown in FIGS. 26 and 27 (patterning step).

By thus executing the above-described steps, the male connector 601 is manufactured (see FIG. 26). Component parts identical to those of the connector according to the second embodiment are denoted by identical reference numerals, and detailed description thereof is omitted. Although in the above-described embodiments, the prism-shaped male-side contact portion 332 is employed as the pin-shaped male-side contact portion, the cylindrical male-side contact portion 333 is employed in the third embodiment (see FIG. 26). Note that the male connectors 301 and 302 of the above-described embodiments may be manufactured by using this manufacturing method.

Although in the above-described embodiments, the prism-shaped male-side contact portion 332 and the cylindrical male-side contact portion 333 are employed as the pin-shaped male-side contact portion, the pin shape of the male-side contact portion is not limited to these, but a pin shape other than the cylindrical shape and the prism shape may be employed.

Further, although in the above-described embodiments, the male connectors 301, 302, and 601 include the protruding portions 352 or 362, and the female connector 501 includes the protruding portion-receiving holes 571, the protruding portions 352 and 362 and the protruding portion-receiving holes 571 may be omitted.

Although in the above-described embodiments, the construction is employed in which the male-side contact portion 531 is elastically deformed to thereby sandwich the male-side contact portion 332 in the predetermined direction orthogonal to the thickness direction T2 of the female-side insulating film 510, it is not necessary to employ the construction for sandwiching the male-side contact portion 332. Further, although when the male-side contact portion 332 is inserted in the female-side contact portion 531, the spring portions 531B are hardly elastically deformed, the male-side contact portion 332 and the female-side contact portion 531 may be constructed such that the male-side contact portion 332 is brought into contact with the female-side contact portion 531, whereby the spring portions 531B are elastically deformed.

Further, although in the above-described embodiments, by forming the male-side contact portion 332 such that the front end portion thereof is expanded, the female-side contact portion 531 is sandwiched by the front end portion of the male-side contact portion 332 and the male side insulting film 310 in the thickness direction T1 of the male side insulting film 310, it is not necessary to employ this construction.

Although in the first embodiment, the male-side contact portion 332 is sandwiched by the pair of contact point portions 531A of the female-side contact portion 531 in the width direction L4 of the female-side insulating film 510 (first predetermined direction in claim 5), and the male connector 301 can be relatively slid in the longitudinal direction L3 of the female-side insulating film 510 (second predetermined direction in claim 5) with respect to the female connector 501, the direction of sliding the male connector 301 is not limited to this, but for example, the male connector 301 may be relatively slid in the width direction L4 of the female-side insulating film 510 (second predetermined direction in claim 6) with respect to the female connector 501, or may not be slid with respect to the female connector 501 as in the second embodiment. Further, when the construction is such that the male-side contact portion 332 is sandwiched between the pair of contact point portions 531A of the female-side contact portion 531 in the longitudinal direction L3 of the female-side insulating film 510 (first predetermined direction in claim 6) and the male connector 301 can be relatively slid in the width direction L4 of the female-side insulating film 510 (second predetermined direction in claim 6) with respect to the female connector 501, the female connector 1101 of the above-described conventional board-to-board connector can be used as the female connector.

Further, although in the first embodiment, the vertical cross-section of the protruding portion 352 is formed to be hook-shaped to form the holding portion 352B, whereby the male connector 301 is locked to the female connector 501 in the thickness direction T2 of the female-side insulating film 510 by the holding portion 352B, it is not necessary to employ this construction, and the protruding portion 352 may not be formed with the holding portion 352B.

It is further understood by those skilled in the art that the foregoing are the preferred embodiments of the present invention, and that various changes and modification may be made thereto without departing from the spirit and scope thereof.

What is claimed is:

1. A method for manufacturing a male connector of a board-to-board connector that comprises a male connector which is mounted on a first substrate, and a female connector which is mounted on a second substrate and which can be fitted to the male connector, the board-to-board connector electrically connecting between the first substrate and the second substrate, the male connector having:
a male-side insulating film;
a plurality of male-side contacts which are provided on said male-side insulating film; and
a male-side reinforcing member which is provided on said male-side insulating film,
each of the male-side contacts having a male-side terminal portion which is connected to the first substrate, and a pin-shaped male-side contact portion which is formed continuously with said male-side terminal portion such that said male-side contact portion protrudes from one surface of said male-side insulating film and can be brought into contact with a corresponding one of female-side contacts of the female connector, a plurality of said male-side contact portions being arrayed on the one surface of said male-side insulating film,
a plurality of said male-side terminal portions being arrayed on the other surface of said male-side insulating film, and
said male-side reinforcing member having a male-side reinforcing member main body portion which is arranged along the plurality of said male-side terminal portions on the other surface;
wherein the method includes:
a thin film processing step for providing a metal thin film on the other surface of said male-side insulating film;
a patterning step for etching said metal thin film and forming the plurality of said male-side terminal portions and said male-side reinforcing member main body portion after said thin film processing step;
a through-hole-forming step for forming, on said male-side insulating film by performing an etching process, through-holes which pass through to said male-side terminal portions after said patterning step; and
a contact-portion-forming step for forming said pin-shaped male-side contact portions at the positions of said through-holes after said through-hole-forming step.

2. The method for manufacturing a male connector of a board-to-board connector according to claim 1, wherein:
the female connector has
a female-side insulating film, and
a plurality of said female-side contacts provided on said female-side insulating film;
each of the female-side contacts has a female-side contact portion which is provided on one surface of said female-side insulating film and which can be brought into contact with a corresponding one of said male-side contact portions, and a female-side terminal portion which is formed continuously with said female-side contact portion such that said female-side terminal portion protrudes from the other surface of said female-side insulating film, said female-side terminal portion being connected to the second substrate;
a plurality of said female-side contact portions are arrayed on the one surface of said female-side insulating film; and
a plurality of said female-side terminal portions are arrayed on the other surface of said female-side insulating film.

3. The method for manufacturing a male connector of a board-to-board connector according to claim 2,
said male-side reinforcing member having:
fixing portions that are formed continuously with said male-side reinforcing member main body portion, and that are arranged on both end portions of the other surface of said male-side insulating film in the direction in which the plurality of said male-side contact portions are arrayed; and
protruding portions that are formed continuously with said fixing portions, and that are arranged on both end portions of the one surface of said male-side insulating film in the direction in which the plurality of said male-side contact portions are arrayed, and
the female connector having protruding-portion-supporting members that are arranged on both end portions of the one surface of said female-side insulating film in the direction in which the plurality of said female-side contact portions are arrayed, and that have protruding-portion-receiving holes for guiding said protruding portions toward the second substrate,
wherein the method includes:
a thin film processing step for providing a metal thin film on the other surface of said male-side insulating film;
a patterning step for etching said metal thin film and forming the plurality of said male-side terminal portions, said male-side reinforcing member main body portion, and said fixing portions after said thin film processing step;
a through-hole-forming step for forming, on said male-side insulating film by performing an etching process, through-holes which pass through to said male-side terminal portions and protruding-portion through-holes which pass through to said fixing portions after said patterning step; and
a contact-portion-forming step for forming said pin-shaped male-side contact portions at the positions of said through-holes, and forming said protruding portions at the positions of said protruding-portion through-holes, after said through-hole-forming step.

4. The method for manufacturing a male connector of a board-to-board connector according to claim 3,
each of the female-side contact portions being elastically deformed, when said protruding portions are inserted in said protruding-portion-receiving holes of the female connector, to thereby sandwich each of the corresponding male-side contact portions in a prescribed direction orthogonal to the thickness direction of said female-side insulating film, whereby a prescribed contact force is generated between said female-side contact portion and said male-side contact portion,
wherein the method includes:
a thin film processing step for providing a metal thin film on the other surface of said male-side insulating film;
a patterning step for etching said metal thin film and forming the plurality of said male-side terminal portions, said male-side reinforcing member main body portion, and said fixing portions after said thin film processing step;
a through-hole-forming step for forming, on said male-side insulating film by performing an etching process, through-holes which pass through to said male-side terminal portions and protruding-portion through-holes which pass through to said fixing portions after said patterning step; and
a contact-portion-forming step for forming said pin-shaped male-side contact portions at the positions of said through-holes, and forming said protruding portions at the positions of said protruding-portion through-holes, after said through-hole-forming step.

5. The method for manufacturing a male connector of a board-to-board connector according to claim 1,
the board-to-board connector comprising a male connector which is mounted on a first substrate, and a female connector which is mounted on a second substrate and which can be fitted to the male connector, the board-to-board connector electrically connecting between the first substrate and the second substrate,
the male connector having:
a male-side insulating film;
a plurality of male-side contacts which are provided on said male-side insulating film; and
a male-side reinforcing member which is provided on said male-side insulating film,
each of the male-side contacts having a male-side terminal portion which is connected to the first substrate, and a pin-shaped male-side contact portion which is formed continuously with said male-side terminal portion such that said male-side contact portion protrudes from one surface of said male-side insulating film and can be brought into contact with a corresponding one of female-side contacts of the female connector, a plurality of said male-side contact portions being arrayed on the one surface of said male-side insulating film, a plurality of said male-side terminal portions being arrayed on the other surface of said male-side insulating film, and said male-side reinforcing member having a male-side reinforcing member main body portion which is arranged along the plurality of said male-side terminal portions on the other surface, wherein the method includes:

a contact-portion-side thin film processing step for providing a contact-portion-side metal thin film on the one surface of said male-side insulating film;

a through-hole-forming step for forming, on said male-side insulating film by performing an etching process, through-holes which pass through to said contact-portion-side metal thin film after said contact-portion-side thin film processing step;

a terminal-portion-side thin film processing step for providing a terminal-portion-side metal thin film on the other surface of said male-side insulating film after said through-hole-forming step; and a patterning step for etching said contact-portion-side metal thin film and forming said pin-shaped male-side contact portions at the positions of said through-holes, and etching said terminal-portion-side metal thin film and forming said male-side terminal portions and said male-side reinforcing member main body portion, after said terminal-portion-side thin film processing step.

6. The method for manufacturing a male connector of a board-to-board connector according to claim 5, wherein:

the female connector has a female-side insulating film, and a plurality of said female-side contacts provided on said female-side insulating film;

each of the female-side contacts has a female-side contact portion which is provided on one surface of said female-side insulating film and which can be brought into contact with a corresponding one of said male-side contact portions, and a female-side terminal portion which is formed continuously with said female-side contact portion such that said female-side terminal portion protrudes from the other surface of said female-side insulating film, said female-side terminal portion being connected to the second substrate;

a plurality of said female-side contact portions are arrayed on the one surface of said female-side insulating film; and a plurality of said female-side terminal portions are arrayed on the other surface of said female-side insulating film.

7. The method for manufacturing a male connector of a board-to-board connector according to claim 6, said male-side reinforcing member having:

fixing portions that are formed continuously with said male-side reinforcing member main body portion, and that are arranged on both end portions of the other surface of said male-side insulating film in the direction in which the plurality of said male-side contact portions are arrayed; and protruding portions that are formed continuously with said fixing portions, and that are arranged on both end portions of the one surface of said male-side insulating film in the direction in which the plurality of said male-side contact portions are arrayed, and the female connector having protruding-portion-supporting members that are arranged on both end portions of the one surface of said female-side insulating film in the direction in which the plurality of said female-side contact portions are arrayed, and that have protruding-portion-receiving holes for guiding said protruding portions toward the second substrate, wherein the method includes:

a contact-portion-side thin film processing step for providing a contact-portion-side metal thin film on the one surface of said male-side insulating film;

a through-hole-forming step for forming, on said male-side insulating film by performing an etching process, through-holes which pass through to said contact-portion-side metal thin film and protruding-portion through-holes after said contact-portion-side thin film processing step;

a terminal-portion-side thin film processing step for providing a terminal-portion-side metal thin film on the other surface of said male-side insulating film after said through-hole-forming step; and a patterning step for etching said contact-portion-side metal thin film and forming said pin-shaped male-side contact portions at the positions of said through-holes, as well as forming said protruding portions at the positions of said protruding-portion through-holes, and etching said terminal-portion-side metal thin film and forming said male-side terminal portions, said male-side reinforcing member, and said fixing portions, after said terminal-portion-side thin film processing step.

8. The method for manufacturing a male connector of a board-to-board connector according to claim 7, wherein each of the female-side contact portions is elastically deformed, when said protruding portions are inserted in said protruding-portion-receiving holes of the female connector, to thereby sandwich each of the corresponding male-side contact portions in a prescribed direction orthogonal to the thickness direction of said female-side insulating film, whereby a prescribed contact force is generated between said female-side contact portion and said male-side contact portion.

9. A method for manufacturing a female connector of a board-to-board connector that comprises a male connector which is mounted on a first substrate, and a female connector which is mounted on a second substrate and which can be fitted to the male connector, the board-to-board connector electrically connecting between the first substrate and the second substrate, the male connector having:

a male-side insulating film;

a plurality of male-side contacts which are provided on said male-side insulating film; and a male-side reinforcing member which is provided on said male-side insulating film, each of the male-side contacts having a male-side terminal portion which is connected to the first substrate, and a pin-shaped male-side contact portion which is formed continuously with said male-side terminal portion such that said male-side contact portion protrudes from one surface of said male-side insulating film and can be brought into contact with a corresponding one of female-side contacts of the female connector, a plurality of said male-side contact portions being arrayed on the one surface of said male-side insulating film,
a plurality of said male-side terminal portions being arrayed on the other surface of said male-side insulating film,
said male-side reinforcing member having a male-side reinforcing member main body portion which is arranged along the plurality of said male-side terminal portions on the other surface,
the female connector having:
a female-side insulating film; and
a plurality of said female-side contacts provided on said female-side insulating film,
each of the female-side contacts having a female-side contact portion which is provided on one surface of said female-side insulating film and which can be brought into contact with a corresponding one of said male-side contact portions, and a female-side terminal portion which is formed continuously with said female-side contact portion such that said female-side terminal portion protrudes from the other surface of said female-side insulating film, said female-side terminal portion being connected to the second substrate,
a plurality of said female-side contact portions being arrayed on the one surface of said female-side insulating film, and
a plurality of said female-side terminal portions being arrayed on the other surface of said female-side insulating film,
wherein the method includes:
a thin film processing step for providing a metal thin film on the one surface of said female-side insulating thin film;
a patterning step for etching said metal thin film on the one surface of said female-side insulating film and forming the plurality of said female-side contact portions after said thin film processing step;
a cutout- and through-hole-forming step for forming, on said female-side insulating film by performing an etching process, cutouts and through-holes which pass through to said female-side contact portions after said patterning step; and
a terminal-portion-forming step for forming, in the other surface of said female-side insulating film, a plurality of said female-side terminal portions at the positions of said cutouts after said cutout- and through-hole-forming step.

10. A method for manufacturing a female connector of a board-to-board connector that comprises a male connector which is mounted on a first substrate, and a female connector which is mounted on a second substrate and which can be fitted to the male connector, the board-to-board connector electrically connecting between the first substrate and the second substrate,
the male connector having:
a male-side insulating film;
a plurality of male-side contacts which are provided on said male-side insulating film; and
a male-side reinforcing member which is provided on said male-side insulating film,
each of the male-side contacts having a male-side terminal portion which is connected to the first substrate, and a pin-shaped male-side contact portion which is formed continuously with said male-side terminal portion such that said male-side contact portion protrudes from one surface of said male-side insulating film and can be brought into contact with a corresponding one of female-side contacts of the female connector,
a plurality of said male-side contact portions being arrayed on the one surface of said male-side insulating film,
a plurality of said male-side terminal portions being arrayed on the other surface of said male-side insulating film,
said male-side reinforcing member having a male-side reinforcing member main body portion which is arranged along the plurality of said male-side terminal portions on the other surface,
the female connector having:
a female-side insulating film; and
a plurality of said female-side contacts provided on said female-side insulating film,
each of the female-side contacts having a female-side contact portion which is provided on one surface of said female-side insulating film and which can be brought into contact with a corresponding one of said male-side contact portions, and a female-side terminal portion which is formed continuously with said female-side contact portion such that said female-side terminal portion protrudes from the other surface of said female-side insulating film, said female-side terminal portion being connected to the second substrate,
a plurality of said female-side contact portions being arrayed on the one surface of said female-side insulating film,
a plurality of said female-side terminal portions being arrayed on the other surface of said female-side insulating film,
the male-side reinforcing member having:
fixing portions that are formed continuously with said male-side reinforcing member main body portion, and that are arranged on both end portions of the other surface of said male-side insulating film in the direction in which the plurality of said male-side contact portions are arrayed; and
protruding portions that are formed continuously with said fixing portions, and that are arranged on both end portions of the one surface of said male-side insulating film in the direction in which the plurality of said male-side contact portions are arrayed, and
the female connector having protruding-portion-supporting members that are arranged on both end portions of the one surface of said female-side insulating film in the direction in which the plurality of said female-side contact portions are arrayed, and that have protruding-portion-receiving holes for guiding said protruding portions toward the second substrate,
wherein the method includes:
a thin film processing step for providing a metal thin film on the one surface of said female-side insulating film;
a patterning step for etching said metal thin film on the one surface of said female-side insulating film and forming the plurality of said female-side contact portions and said protruding-portion-supporting members after said thin film processing step;
a cutout- and through-hole-forming step for forming, on said female-side insulating film by performing an etching process, cutouts and through-holes which pass through to said female-side contact portions after said patterning step; and
a terminal-portion-forming step for forming, in the other surface of said female-side insulating film, a plurality of said female-side terminal portions at the positions of said cutouts after said cutout- and through-hole-forming step.

\* \* \* \* \*